United States Patent
Lee et al.

(10) Patent No.: US 10,431,685 B2
(45) Date of Patent: Oct. 1, 2019

(54) SEMICONDUCTOR DEVICE INCLUDING GATE HAVING DENTS AND SPACER PROTRUSIONS EXTENDING THEREIN

(71) Applicant: Samsung Electronics Co., Ltd., Suwon-si, Gyeonggi-do (KR)

(72) Inventors: Jae-hoon Lee, Suwon-si (KR); Gi-gwan Park, Hwaseong-si (KR); Tae-young Kim, Hwaseong-si (KR); Yi-young Na, Suwon-si (KR); Dae-hee Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 45 days.

(21) Appl. No.: 15/404,673

(22) Filed: Jan. 12, 2017

(65) Prior Publication Data

US 2017/0213905 A1    Jul. 27, 2017

(30) Foreign Application Priority Data

Jan. 22, 2016    (KR) ........................ 10-2016-0008036

(51) Int. Cl.
*H01L 27/088*    (2006.01)
*H01L 29/78*    (2006.01)
*H01L 29/06*    (2006.01)
*H01L 29/417*    (2006.01)
*H01L 29/423*    (2006.01)
(Continued)

(52) U.S. Cl.
CPC .... *H01L 29/785* (2013.01); *H01L 21/823431* (2013.01); *H01L 21/823456* (2013.01); *H01L 29/0649* (2013.01); *H01L 29/41791* (2013.01); *H01L 29/42376* (2013.01); *H01L 29/66545* (2013.01); *H01L 29/66553* (2013.01); *H01L 29/66795* (2013.01); *H01L 29/7854* (2013.01)

(58) Field of Classification Search
None
See application file for complete search history.

(56) References Cited

U.S. PATENT DOCUMENTS

| 6,025,635 A | * | 2/2000 | Krivokapic | ....... H01L 21/28114 |
| | | | | 257/288 |
| 6,503,844 B2 | | 1/2003 | Curello | |
| 8,232,155 B2 | | 7/2012 | Zhu et al. | |

(Continued)

FOREIGN PATENT DOCUMENTS

| KR | 10-0541703 B1 | 1/2006 |
| KR | 2007/0073440 A | 7/2007 |

*Primary Examiner* — Matthew E. Gordon
(74) *Attorney, Agent, or Firm* — Harness, Dickey & Pierce, P.L.C.

(57) ABSTRACT

A semiconductor device includes a substrate including a fin-shaped active region that protrudes from the substrate; a gate insulating film covering a top surface and both side walls of the fin-shaped active region; a gate electrode on the top surface and the both side walls of the fin-shaped active region and covering the gate insulating film; one pair of insulating spacers on both side walls of the gate electrode; and a source region and a drain region on the substrate and respectively located on sides of the gate electrode. The source region and the drain region form a source/drain pair. The one pair of insulating spacers include protrusions that protrude from upper portions of the one pair of insulating spacers toward the gate electrode.

16 Claims, 34 Drawing Sheets

(51) Int. Cl.
*H01L 29/66* (2006.01)
*H01L 21/8234* (2006.01)

(56) References Cited

U.S. PATENT DOCUMENTS

| | | | |
|---|---|---|---|
| 8,586,455 | B1 | 11/2013 | Chang et al. |
| 8,617,973 | B2 * | 12/2013 | Xie .................. H01L 21/28088 257/288 |
| 8,679,961 | B2 | 3/2014 | Ikeda |
| 8,822,283 | B2 | 9/2014 | Ng et al. |
| 9,048,334 | B2 | 6/2015 | Lim et al. |
| 9,093,467 | B1 | 7/2015 | Xie et al. |
| 9,147,753 | B2 | 9/2015 | Colinge et al. |
| 2004/0113212 | A1 * | 6/2004 | Lee .................. H01L 21/28114 257/408 |
| 2004/0157385 | A1 | 8/2004 | Ikezawa |
| 2010/0084719 | A1 * | 4/2010 | Masuoka .......... H01L 21/28088 257/411 |
| 2013/0015532 | A1 * | 1/2013 | Kim .................. H01L 21/82345 257/380 |
| 2013/0264617 | A1 | 10/2013 | Joshi et al. |
| 2015/0126012 | A1 | 5/2015 | Jeong et al. |
| 2015/0318178 | A1 | 11/2015 | Pham et al. |
| 2017/0005165 | A1 * | 1/2017 | Chen .................. H01L 29/785 |
| 2017/0330955 | A1 * | 11/2017 | Rahhal-Orabi .............................. H01L 21/28114 |

\* cited by examiner

C - C'

C – C'

SEMICONDUCTOR DEVICE INCLUDING GATE HAVING DENTS AND SPACER PROTRUSIONS EXTENDING THEREIN

CROSS-REFERENCE TO RELATED APPLICATION

This application claims priority under 35 U.S.C. § 119 to Korean Patent Application No. 10-2016-0008036, filed on Jan. 22, 2016, in the Korean Intellectual Property Office, the disclosure of which is incorporated herein in its entirety by reference.

BACKGROUND

The present disclosure relates to a semiconductor device and/or a method of manufacturing the same, and more particularly, to a semiconductor device including source/drain regions including a semiconductor layer that is epitaxially grown and/or a method of manufacturing the semiconductor device.

With the progress of electronic technology, semiconductor devices are required to operate fast. As downscaling to achieve fast operations of semiconductor devices is aggressively performed and the design rules for semiconductor devices sharply decrease, electrical failures during manufacturing processes increase.

SUMMARY

Inventive concepts relate to a semiconductor device with improved reliability by limiting and/or preventing electrical failures and/or a method of manufacturing the semiconductor device.

According to example embodiments of inventive concepts, a semiconductor device includes a substrate including a fin-shaped active region that protrudes from the substrate; a gate insulating film covering a top surface and both side walls of the fin-shaped active region; a gate electrode on the top surface and the both side walls of the fin-shaped active region, the gate electrode covering the gate insulating film; one pair of insulating spacers on both side walls of the gate electrode; and a source region and a drain region on the substrate and respectively located on sides of the gate electrode. The source region and the drain region form a source/drain pair. The one pair of insulating spacers includes protrusions that protrude from upper portions of the one pair of insulating spacers toward the gate electrode.

According to example embodiments of inventive concepts, a semiconductor device includes: a substrate including a first region and a second region; a gate electrode on the substrate, the gate electrode extending across the first region and the second region; one pair of insulating spacers on both side walls of the gate electrode, upper portions of side walls of the one pair of insulating spacers that are located in at least one of the first region and the second region include curved portions that face each other and the gate electrode; and a source region and a drain region on the substrate. The source region and the drain region respectively located on sides of the gate electrode in at least one of the first region and the second region. The source region and the drain region form a source/drain pair.

According to example embodiments of inventive concepts, a method of manufacturing a semiconductor device includes sequentially forming a pre-dummy gate insulating film and a pre-dummy gate electrode film on a substrate, the substrate including a fin-shaped active region that protrudes from the substrate; forming an ion implantation portion in an upper portion of the pre-dummy gate electrode film by implanting ions into the pre-dummy gate electrode film; forming a gate mask layer on the pre-dummy gate electrode film; forming a dummy gate electrode and a dummy gate insulating film by etching the pre-dummy gate electrode film in which the ion implantation portion is formed and the pre-dummy gate insulating film using the gate mask layer on the pre-dummy gate electrode film as an etching mask, the forming the dummy gate electrode including forming a dent portion in the ion implantation of the dummy gate electrode; and forming insulating spacers on side walls of the dummy gate electrode and the dummy gate insulating film.

According to example embodiments of inventive concepts, a semiconductor device includes: a substrate including a trench that defines a fin-shaped active region extending in a first direction, the fin-shaped active region including sidewalls; a source region and a drain region spaced apart from each other on the fin-shaped active region; and a gate structure on a portion of the fin-shaped active region between the source region and the drain region. The gate structure extends in a second direction that crosses the first direction. The gate structure includes a gate electrode on a gate insulating film. The gate electrode includes dents formed in both sides of the gate electrode. The gate insulating film covering a top surface and the side walls of the fin-shaped active region. The gate insulating film includes a curved part that curves into the dents of the gate electrode.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF THE EMBODIMENTS

Example embodiments of inventive concepts will now be described more fully with reference to the accompanying drawings, in which example embodiments of inventive concepts are shown.

Figure 1A:
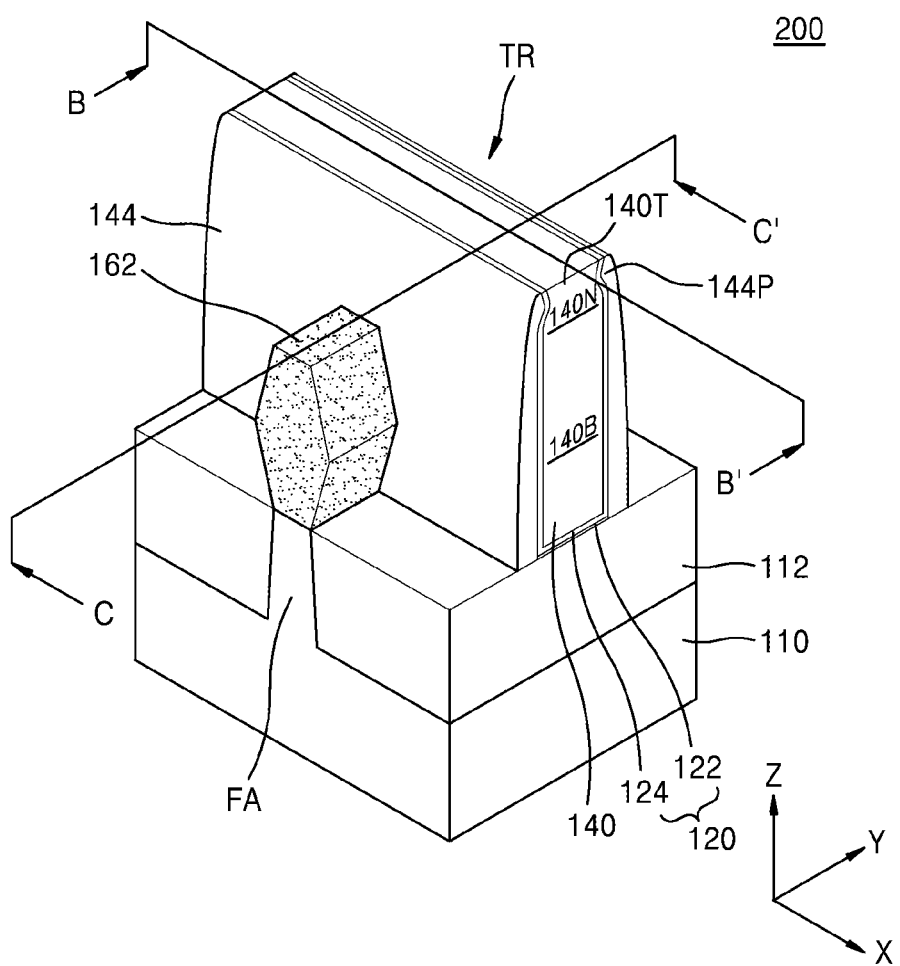
FIGS. 1A through 1C are a perspective view and cross-sectional views illustrating main elements of a semiconductor device according to example embodiments.
Figure 1B:
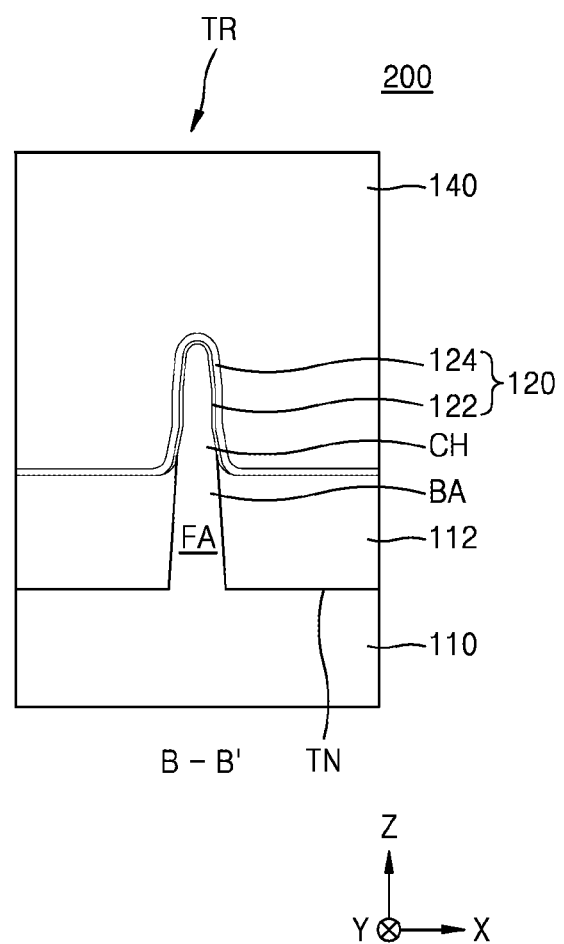
Figure 1C:
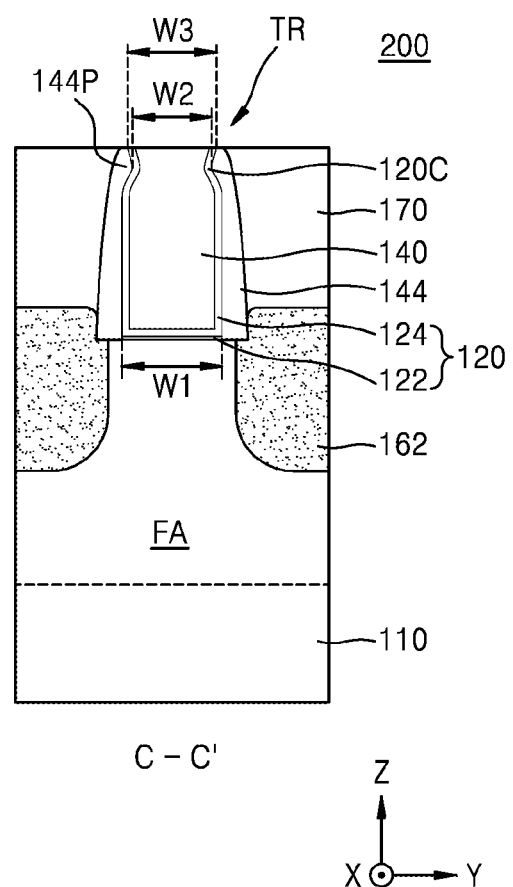

FIGS. 1A through 1C are a perspective view and cross-sectional views illustrating main elements of a semiconductor device 200 according to example embodiments. FIG. 1A is a perspective view illustrating main elements of the semiconductor device 200 including a transistor having a fin field effect transistor (FinFET) structure. FIG. 1B is a cross-sectional view taken along line B-B' of FIG. 1A. FIG. 1C is a cross-sectional view taken along line C-C' of FIG. 1A.

Referring to FIGS. 1A through 1C, the semiconductor device 200 may include a fin-shaped active region FA that protrudes from a substrate 110 in a direction (e.g., a Z direction) perpendicular to a main surface of the substrate 110.

The substrate 110 may include a semiconductor material. The substrate 110 may be formed of at least one of a group III-V material and a group IV material. The substrate 110 may include, for example, silicon (Si). Alternatively, the substrate 110 may include a semiconductor element such as germanium (Ge), or a compound semiconductor material such as silicon germanium (SiGe), silicon carbide (SiC), gallium arsenide (GaAs), indium arsenide (InAs), or indium phosphide (InP). The group III-V material may be a binary, ternary, or quaternary compound including at least one group III element and at least one group V element. The group III-V material may be a compound including at least one of indium (In), gallium (Ga), and aluminum (Al) as a group III element and at least one of arsenic (As), phosphorus (P), and antimony (Sb) as a group V element. For example, the group III-V material may be selected from InP, $In_zGa_{1-z}As$ ($0 \leq z \leq 1$), and $Al_zGa_{1-z}As$ ($0 \leq z \leq 1$). The binary compound may be any one of, for example, InP, GaAs, InAs, InSb, and GaSb. The ternary compound may be any one of, for example, InGaP, InGaAs, AlInAs, InGaSb, GaAsSb, and GaAsP. The group IV material may be Si or Ge. However, the group III-V material and the group IV material that may be used in the semiconductor device 200 are not limited to the above materials. The group III-V material and the group IV material such as Ge may be used as a channel material for obtaining a low-power, high-speed transistor. A high-performance complementary metal-oxide-semiconductor (CMOS) may be formed by using a semiconductor substrate formed of a group III-V material, for example, GaAs, having a higher electron mobility than a Si substrate, and a semiconductor substrate formed of a semiconductor material, for example, Ge, having a higher hole mobility than the Si substrate. In example embodiments, when an NMOS transistor is formed on the substrate 110, the substrate 110 may be formed of any one of the above group III-V materials. In other embodiments, when a PMOS transistor is formed on the substrate 110, at least a part of the substrate 110 may be formed of Ge. In example embodiments, the substrate 110 may have a silicon-on-insulator (SOI) structure or a germanium-on-insulator (GOI) structure. For example, the substrate 110 may include a buried oxide (BOX) layer. The substrate 110 may include a conductive region, for example, a well doped with impurities. The substrate 110 may have any of various device isolation structures such as a shallow trench isolation (STI) structure or a deep trench isolation (DTI) structure.

The fin-shaped active region FA may extend in one direction (e.g., a Y direction in FIGS. 1A through 1C). A device isolation film 112 that covers side walls of a lower portion of the fin-shaped active region FA is formed on the substrate 110. The fin-shaped active region FA protrudes upward beyond a top surface of the device isolation film 112 to have a fin shape. Although one fin-shaped active region FA is illustrated in FIGS. 1A through 1C, a plurality of the fin-shaped active regions FA that extend in parallel to one another in the one direction (e.g., the Y direction) may be formed. Also, the plurality of fin-shaped active regions FA may be arranged in the one direction (e.g., the Y direction) to be spaced apart from each other by a desired (and/or alternatively predetermined) interval.

In example embodiments, a width of an upper portion of the fin-shaped active region FA in one direction (e.g., an X direction in FIGS. 1A through 1C) may be less than a width of the lower portion of the fin-shaped active region FA. In example embodiments, an upper end of the fin-shaped active region FA may have a round shape.

The device isolation film 112 may include an insulating film. For example, the device isolation film 112 may include silicon-containing insulating film such as a silicon oxide film, a silicon nitride film, a silicon oxynitride film, or a silicon carbonitride film, polysilicon, or a combination thereof. The device isolation film 112 may fill a lower portion of a trench TN formed in the substrate 110. The device isolation film 112 may be formed by using, but not limited to, plasma enhanced chemical vapor deposition (PECVD), high density plasma CVD (HDP CVD), inductively coupled plasma CVD (ICP CVD), capacitor coupled plasma CVD (CCP CVD), flowable chemical vapor deposition (FCVD), and/or spin coating.

In example embodiments, the device isolation film 112 may have a multi-film structure. For example, the device isolation film 112 may include first and second liners sequentially stacked on an inner wall of the trench TN and a buried insulating film formed on the second liner. The first liner may include, for example, an oxide such as silicon oxide, and the second liner may include, for example, polysilicon or a nitride such as silicon nitride. The buried insulating film may include, for example, an oxide such as silicon oxide.

The fin-shaped active region FA may have a channel portion CH, and a base portion BA that is disposed under the channel portion CH and has both side walls covered by the device isolation film 112. In example embodiments, the channel portion CH of the fin-shaped active region FA may be formed of a single material. For example, all portions of the fin-shaped active region FA including the channel portion CH may be formed of Si. In other embodiments, a part of the fin-shaped active region FA may be formed of Ge and another part of the fin-shaped active region FA may be formed of Si.

A gate insulating film 120 may be formed to cover a top surface and both side walls of the fin-shaped active region FA. A gate electrode 140 may be formed over the top surface and the both side walls of the fin-shaped active region FA to cover the gate insulating film 120. The gate electrode 140 may extend in one direction (e.g., the X direction in FIGS. 1A through 1C). The direction (e.g., the X direction) in which the gate electrode 140 extends may be perpendicular to a direction in which the fin-shaped active region FA extends.

The gate insulating film 120 may be formed of silicon oxide, silicon nitride, silicon oxynitride, gallium oxide, germanium oxide, a high-k dielectric material, or a combination thereof. However, example embodiments are not limited thereto.

The gate insulating film 120 may include an interface film 122 having a first relative dielectric constant and a high-k dielectric film 124 formed on the interface film 122 and having a second relative dielectric constant higher than the first relative dielectric constant. The interface film 122 of the semiconductor device 200 may be formed between the top surface and the both side walls of the fin-shaped active region FA and a bottom surface of the gate electrode 140 to face the bottom surface of the gate electrode 140, and the high-k dielectric film 124 may be formed to face the bottom surface and both side walls of the gate electrode 140. The gate insulating film 120 may include a curved part 120C that curves into a dented part of the gate electrode 140.

The interface film 122 may be formed of a low-k dielectric material having a relative dielectric constant (e.g., in a range that is about 9 or less and greater than 0), for example, but not limited to, silicon oxide, silicon nitride, silicon oxynitride, gallium oxide, or germanium oxide. The interface film 122 may be an oxide, a nitride, or an oxynitride of a material of the substrate 110. The interface film 122 may have a thickness ranging, but not limited to, from about 5 Å to about 20 Å. The interface film 122 may be formed by using thermal oxidation, atomic layer deposition (ALD), CVD, or physical vapor deposition (PVD).

The high-k dielectric film 124 may be formed of a high-k dielectric material having a relative dielectric constant ranging from about 10 to about 25 that is higher than that of the interface film 122. The high-k dielectric film 124 may be formed of a material having a relative dielectric constant higher than that of, for example, a silicon oxide film or a silicon nitride film. The high-k dielectric film 124 may be formed of a material selected from among, but not limited to, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof. The high-k dielectric film 124 may be formed by using ALD, CVD, or PVD. The high-k dielectric film 124 may have a thickness ranging, for example, but not limited to, from about 10 Å to about 40 Å.

The gate electrode 140 may be formed of at least one metal selected from among, for example, titanium (Ti), tantalum (Ta), aluminum (Al), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), a metal nitride including at least one metal, or a metal compound such as a carbon-doped metal or a carbon-doped metal nitride.

The gate electrode 140 may include a single film or may have a multi-film structure including a plurality of films. The gate electrode 140 may include, for example, a work function adjusting metal-containing layer and a gap filling metal-containing layer that fills a space formed over the work function adjusting metal-containing layer.

In example embodiments, the gate electrode 140 may have a structure in which a metal nitride layer, a metal layer, a conductive capping layer, and a gap-fill metal film are sequentially stacked. Each of the metal nitride layer and the metal layer may include at least one metal atoms selected from among Ti, W, Ru, Nb, Mo, Hf, Ni, Co, Pt, Yb, Tb, Dy, Er, and Pd. Each of the metal nitride layer and the metal layer may be formed by using ALD, metal organic ALD (MOALD), or metal organic CVD (MOCVD). The conductive capping layer may function as a protective film for limiting and/or preventing a surface of the metal layer from being oxidized. Also, the conductive capping layer may function as a wetting layer for easily depositing another conductive layer on the metal layer. The conductive capping layer may be formed of, but not limited to, a metal nitride such as TiN, TaN, or a combination thereof. The gap-fill metal film may extend over the conductive capping layer. The gap-fill metal film may be a tungsten (W) film. The gap-fill metal film may be formed by using ALD, CVD, or PVD. The gap-fill metal film may cover a recess space formed by a stepped portion between regions on a top surface of the conductive capping layer without voids. In example embodiments, the gate electrode 140 may have a TiAlC/TiN/W stacked structure, a TiN/TaN/TiAlC/TiN/W stacked structure, or a TiN/TaN/TiN/TiAlC/TiN/W stacked structure. In the stacked structures, a TiAlC layer or a TiN layer may function as a work function adjusting metal-containing layer.

Source/drain regions 162 may be formed on portions of the fin-shaped active region FA located on both sides of the gate electrode 140. The source/drain regions 162 may include a semiconductor layer that is epitaxially grown from the fin-shaped active region FA. The source/drain regions 162 may include an embedded SiGe structure including a plurality of SiGe layers that are epitaxially grown, a Si layer that is epitaxially grown, or a SiC layer that is epitaxially grown.

Although the source/drain regions 162 have a specific shape in FIGS. 1A and 1C, a cross-sectional shape of the source/drain regions 162 is not limited to the shape of the source/drain regions 162 in FIGS. 1A and 1C and may be any of various other shapes.

A transistor TR may be formed at an intersection between the fin-shaped active region FA and the gate electrode 140. The transistor TR is a three-dimensional (3D) MOS transistor in which channels are formed on the top surface and the both side walls of the fin-shaped active region FA. The transistor TR may be an NMOS transistor or a PMOS transistor.

Insulating spacers 144 may be formed on both sides of a gate structure including the gate insulating film 120 and the gate electrode 140 sequentially formed from a surface of the fin-shaped active region FA. That is, one pair of insulating spacers 144 may be formed on both side walls of the gate insulating film 120 and the gate electrode 140. As shown in FIG. 1C, an interlayer insulating film 170 that covers the insulating spacers 144 may be formed at a side of the insulating spacers 144 opposite to the gate structure. The insulating spacers 144 may include, but not limited to a silicon nitride film, a silicon oxynitride film, a carbon-containing silicon oxynitride film, or a combination film thereof, or may have an air gap or a low-k dielectric film therein. The interlayer insulating film 170 may include, but not limited to, a silicon oxide film such as tetra ethyl ortho silicate (TEOS).

The insulating spacers 144 may include protrusions 144P that protrude from upper portions, that is, portions close to upper ends, toward the gate electrode 140. The protrusions 144P may be formed to be lower than uppermost ends of the insulating spacers 144. Accordingly, inner walls of the insulating spacers 144 facing the gate electrode 140 may have curved portions bulging toward the gate electrode 140 at the protrusions 144P. The term 'curved portions' used herein refer to side wall portions of the protrusions 144P of the insulating spacers 144 protruding toward the gate electrode 140. Accordingly, although the curved portions are not separately explained, the inner walls of the insulating spacers 144 including the protrusions 144P may have the curved portions.

The one pair of insulating spacers 144 formed on both sides of the gate electrode 140 may the protrusions 144P that face each other. A width between the one pair of insulating spacers 144 in the one direction (e.g., the Y direction) may decrease at the protrusions 144P due to the protrusions 144P of the one pair insulating spacers 144. A width of each of the insulting spacers 144 in the one direction (e.g., the Y direction) may decrease as each insulating spacer 144 extends from the substrate 110 in the direction (e.g., the Z direction) perpendicular to the main surface of the substrate 110, may increase at each of the protrusions 144P, and may decrease again as each insulating spacer 144 extends to the uppermost end.

In detail, a space defined between the one pair of insulating spacers 144 may have first through third widths W1, W2, and W3 in the direction (e.g., the Z direction) perpendicular to the main surface of the substrate 110. In detail, a space between lower end portions of the one pair of insulating spacers 144 may have the first width W1, a space between the protrusions 144P of the one pair of insulating spacers 144 may have the second width W2 that is less than the first width W1, and a space between upper ends of the one pair of insulating spacers 144 may have the third width W3 that is less than the first width W1 and greater than the second width W2.

That is, a space defined between the one pair of insulating spacers 144 may extend to have the first width W1, which is constant, in the direction (e.g., the Z direction) perpendicular to the main surface of the substrate 110 from the lower ends of the one pair of insulating spacers 144, may be narrowed to have the second width W2, which is less than the first width W1, between the protrusions 144P, and then may be widened again to have the third width W32, which is less than the first width W1 and greater than the second width W2, at the uppermost ends of the one pair insulating spacers 144. Accordingly, a space defined between the one pair of insulating spacers 144 may have the second width W2, which is a smallest width, at upper portions of the one pair of insulating spacers 144 that are lower than the uppermost ends of the one pair of insulating spacers 144.

The gate insulating film 120 may be formed to cover an inner surface of the space defined between the one pair of insulating spacers 144. The gate electrode 140 may be formed to cover the gate insulating film 120 and to fill the space defined between the one pair of insulating spacers 144. The gate insulating film 120 may have a constant thickness or a relatively small thickness on the inner walls of the insulating spacers 144. Accordingly, a width of the gate electrode 140 in the one direction (e.g., the Y direction) may change in a similar way to that of a width of the space defined between the one pair of insulating spacers 144 in the direction (e.g., the Z direction) perpendicular to the main surface of the substrate 110.

The gate electrode 140 may include a base portion 140B disposed on a portion of the space defined between the one pair of insulating spacers 144 that has the first width W1, a narrow width portion 140N disposed on a portion of the space that has the second width W2, and an upper end portion 140T disposed on a portion of the space that has the third width W3. The narrow width portion 140N of the gate electrode 140 may have a width that is less than that of each of the base portion 140B and the upper end portion 140T. Accordingly, the gate electrode 140 may have dents in side walls of a portion corresponding to the protrusions 144P of the insulating spacers 144, that is, in side walls of the narrow width portion 140N of the gate electrode 140. That is, dents may be formed in both side walls of an upper portion of the gate electrode 140 facing the one pair of insulating spacers 144.

In example embodiments, the insulating spacers 144 may be a combination film including a first insulating spacer having an L-shape and a second insulating spacer formed on the first insulating spacer. In example embodiments, the second insulating spacer may be omitted, and in this case, the insulating spacers 144 may have an L-shape. In example embodiments, the insulating spacers 144 may further have an air gap in a space between the first insulating spacer and the second insulating spacer. In example embodiments, the insulating spacers 144 may be formed so that the air gap is filled with a low-k dielectric film having a relative dielectric constant lower than that of each of the first and second insulating spacers. The term "L-shape" used herein refers to an L-shape whose upper portions have curved portions corresponding to the protrusions 144P.

In example embodiments, the semiconductor device 200 may further include a nanosheet stacked structure spaced apart from the top surface of the fin-shaped active region FA to face the top surface of the fin-shaped active region FA. The nanosheet stacked structure may include a plurality of nanosheets that extend in parallel to the top surface of the fin-shaped active region FA. The plurality of nanosheets may include a channel region. The gate electrode 140 may surround at least a part of the channel region. The nanosheets may be formed of a group IV semiconductor, a group IV-IV compound semiconductor, or a group III-V compound semiconductor. For example, the nanosheets may be formed of Si, Ge, or SiGe, or may be formed of InGaAs, InAs, GaSb, InSb, or a combination thereof. When the semiconductor device 200 further includes the nanosheet stacked structure, the gate insulating film 120 may be disposed between the channel region and the gate electrode 140. The source/drain regions 162 may contact both end portions of the plurality of nanosheets, and the both end portions of the plurality of nanosheets adjacent to the source/drain regions 162 may be covered by the insulating spacers 144 that cover the side walls of the gate electrode 140. One pair of inner insulating spacers may be formed between the fin-shaped active region FA and the nanosheets. The one pair of inner insulating spacers may be disposed between the gate electrode 140 and the source/drain regions 162. The inner insulating spacers may be formed of a material different from that of the gate insulating film 120. The inner insulating spacers may be formed of a material having a dielectric constant that is lower than a dielectric constant of a material of the gate insulating film 120. For example, the inner insulating spacers may be formed of, but not limited to, an oxide of a material of the nanosheets. The gate insulating film 120 may extend from a surface of the channel region to surfaces of side walls of the inner insulating spacers to be disposed between the gate electrode 140 and the inner insulating spacers formed between the fin-shaped active region FA and the nanosheets.

FIGS. 2 through 15B are cross-sectional views for explaining a method of manufacturing a semiconductor device according to example embodiments. FIGS. 2 through 15B are cross-sectional views for explaining a method of manufacturing a semiconductor device including a transistor having a FinFET structure. A method of manufacturing the semiconductor device 200 of FIGS. 1A through 1C will now be exemplarily explained with reference to FIGS. 2 through 15B. In detail, FIGS. 2, 3, 4, 5A, 6A, 7A, 8A, 9A, 14A, and 15A are cross-sectional views taken along line B-B' of FIG. 1A. FIGS. 5B, 6B, 7B, 8B, 9B, 10, 11, 12, 13B, 14B, and 15B are cross-sectional views taken along line C-C' of FIG. 1A. In FIGS. 2 through 15B, the same elements as those in FIGS. 1A through 1C are denoted by the same reference numerals, and a detailed explanation thereof will not be given.

Figure 2:
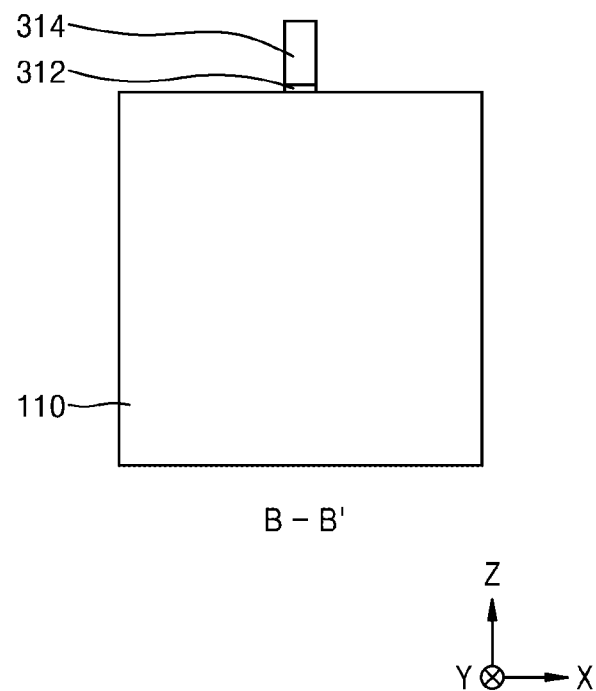
FIGS. 2 through 15B are cross-sectional views for explaining a method of manufacturing a semiconductor device according to example embodiments.

Referring to FIG. 2, the substrate 110 is prepared, and then a pad oxide film pattern 312 and a first mask pattern 314 are formed on the substrate 110.

The pad oxide film pattern 312 and the first mask pattern 314 may extend in one direction (e.g., the Y direction) on the substrate 110.

In example embodiments, the pad oxide film pattern 312 may include an oxide film obtained by thermally oxidizing a surface of the substrate 110. The first mask pattern 314 may include, but not limited to, a silicon nitride film, a silicon oxynitride film, a spin-on-glass (SOG) film, a spin-on hardmask (SOH) film, a photoresist film, or a combination thereof.

Figure 3:
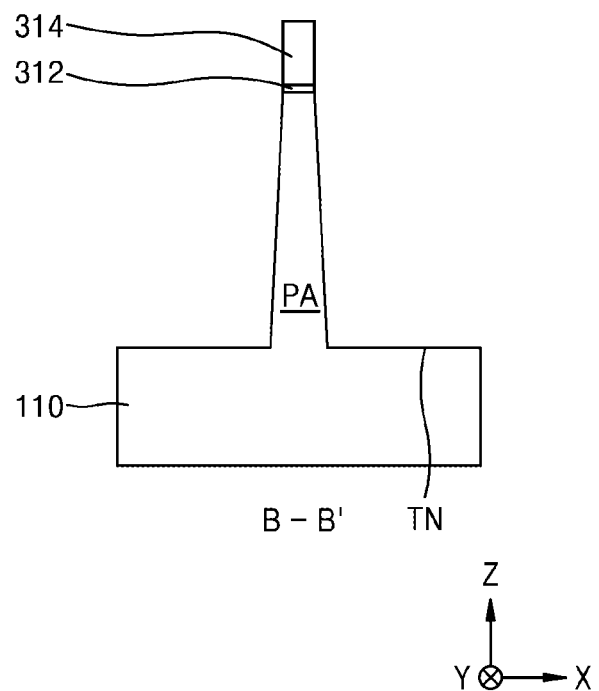

Referring to FIG. 3, the trench TN is formed in the substrate 110 by etching a portion of the substrate 110 by using the first mask pattern 314 as an etching mask. As the trench TN is formed, a pre-fin-shaped active region PA that protrudes from the substrate 110 upward in the direction (e.g., the Z direction) perpendicular to the main surface of the substrate 110 and extends in one direction (e.g., the Y direction) may be obtained.

Figure 4:
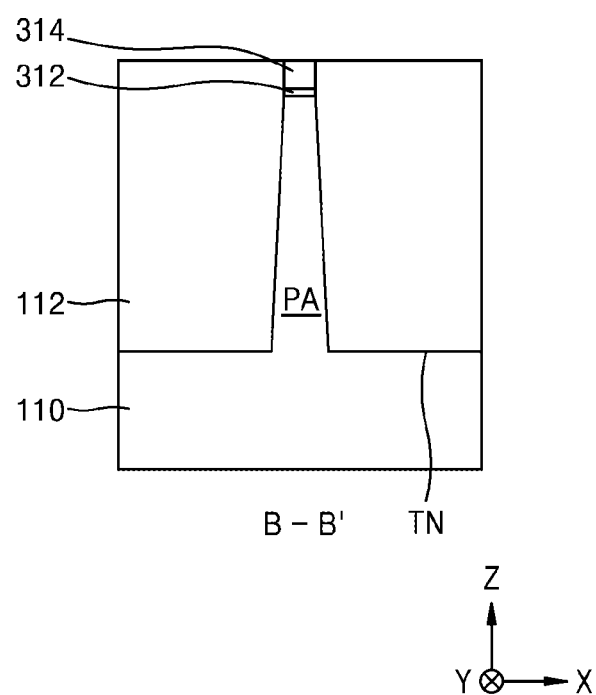

Referring to FIG. 4, the device isolation film 112 that fills the trench TN to cover an exposed surface of the pre-fin-shaped active region PA is formed.

The device isolation film 112 may be formed by using, but not limited to, PECVD, HDP CVD, ICP CVD, CCP CVD, FCVD, and/or spin coating.

After the device isolation film 112 is formed, a top surface may be planarized to expose the first mask pattern 314. In this case, a part of the first mask pattern 314 may be removed, and thus a height of the first mask pattern 314 may be reduced.

Figure 5A:
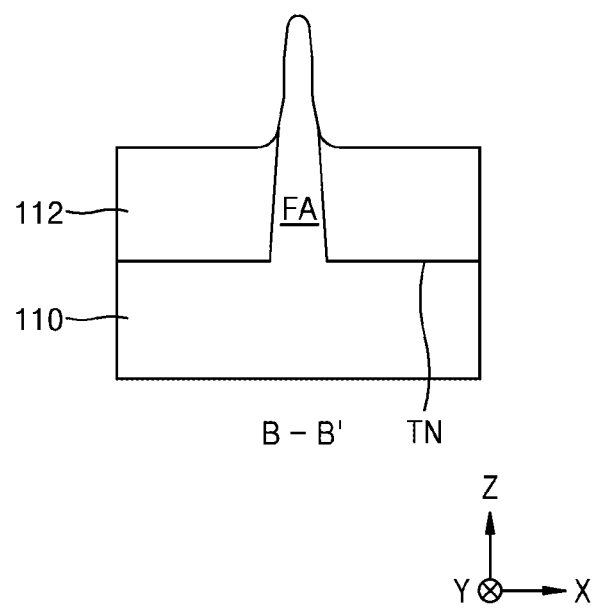
Figure 5B:
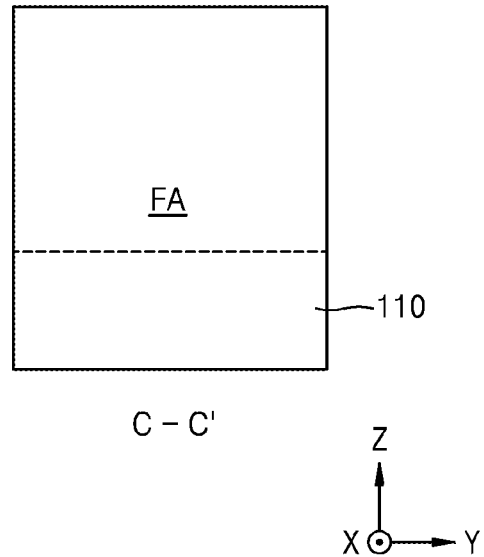

Referring to FIGS. 5A and 5B, the mask pattern 314 (see FIG. 4) and the pad oxide film pattern 312 (see FIG. 4) are removed to expose a top surface and upper side walls of the pre-fin-shaped active region PA (see FIG. 4), and a recess process for removing a part of the device isolation film 112 is performed. As a result, a height of the top surface of the device isolation film 112 may be reduced, and the fin-shaped active region FA may be obtained.

In order to perform the recess process, a dry etching process, a wet etching process, or a combination process thereof may be used.

When the first mask pattern 314 includes a silicon nitride film, a wet etching process using, for example, $H_3PO_4$, may be performed to remove the first mask pattern 314. A wet etching process using, for example, dilute hydrofluoric acid (DHF), may be performed to remove the pad oxide film pattern 312. In order to perform the recess process on the device isolation film 112, a wet etching process using $NH_4OH$, tetramethyl ammonium hydroxide (TMAH), or potassium hydroxide (KOH) as an etchant or a dry etching process such as inductively coupled plasma (ICP), transformer coupled plasma (TCP), electron cyclotron resonance (ECR), or reactive ion etching (RIE) may be used. When the recess process is performed on the device isolation film 112 by using dry etching, a fluorine-containing gas such as $CF_4$, a chlorine-containing gas such as $Cl_2$, or HBr may be used. However, example embodiments are not limited thereto.

While the recess process is performed, an exposed upper portion of the fin-shaped active region FA may be exposed to an etching atmosphere such as plasma, and an exposed surface of the fin-shaped active region FA may be damaged due to the etching atmosphere or a roughness of the exposed surface of the fin-shaped active region FA may be degraded. Accordingly, in example embodiments, in order to improve the roughness of the exposed surface of the fin-shaped active region FA, a wet etching process may be performed or a process of forming and removing a sacrificial oxide film may be performed. In a process of removing a part of the device isolation film 112 or improving the roughness of the exposed surface of the fin-shaped active region FA, a width of the channel portion CH (see FIG. 1B) of the fin-shaped active region FA that is exposed on the top surface of the device isolation film 112 in one direction (e.g., the X direction) may be less than that of the pre-fin-shaped active region PA. Also, an upper end of the fin-shaped active region FA may have a round shape.

In example embodiments, impurity ion implantation for adjusting a threshold voltage may be performed on an upper portion of the fin-shaped active region FA. During the impurity ion implantation for adjusting the threshold voltage, boron (B) ions may be implanted as impurities to form an NMOS transistor and phosphorus (P) or arsenic (As) may be implanted as impurities to form a PMOS transistor. The impurity ion implantation for adjusting the threshold voltage may be performed before or after the process of improving the roughness of the exposed surface of the fin-shaped active region FA is performed.

Figure 6A:
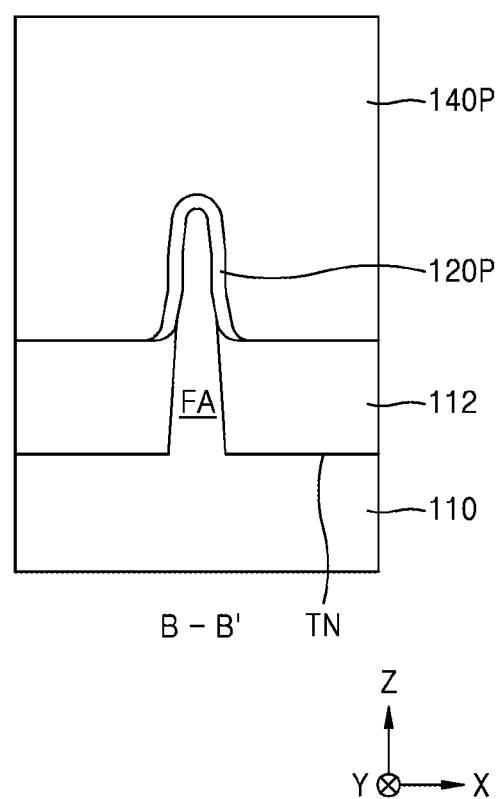
Figure 6B:
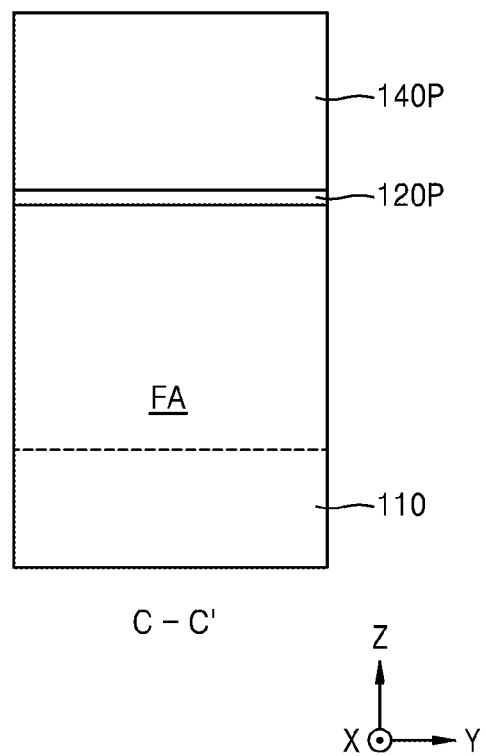

Referring to FIGS. 6A and 6B, a pre-dummy gate insulating film 120P and a pre-dummy gate electrode film 140P are formed on the substrate 110 including the fin-shaped active region FA. The pre-dummy gate insulating film 120P may include, for example, but not limited to, a silicon oxide film, and the pre-dummy gate electrode 140P may include, for example, but not limited to, polysilicon.

The pre-dummy gate insulating film 120P may be formed by using CVD or ALD. Alternatively, the pre-dummy gate insulating film 120P may be formed by performing thermal oxidation on an upper portion of the substrate 110. In this case, the pre-dummy gate insulating film 120P may be formed only on the top surface of the fin-type active region FA. The pre-dummy gate electrode film 140P may be formed by using CVD or ALD.

Figure 7A:
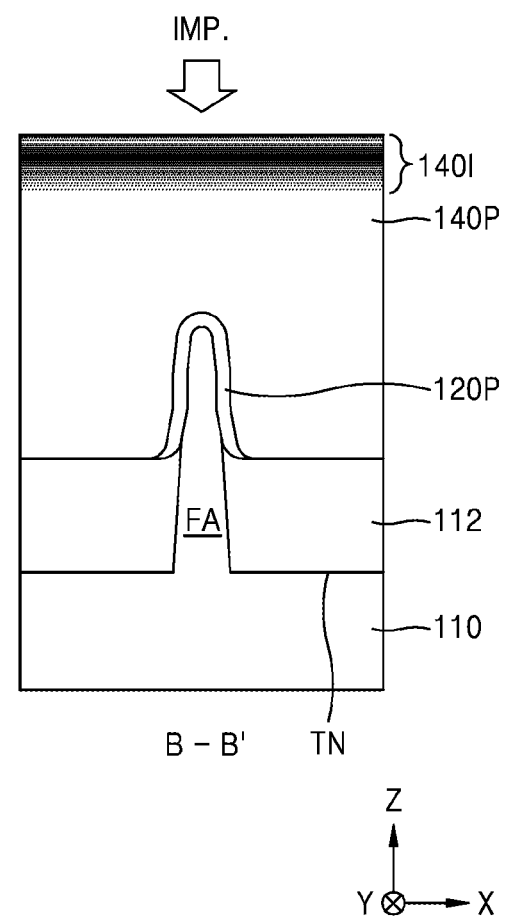
Figure 7B:
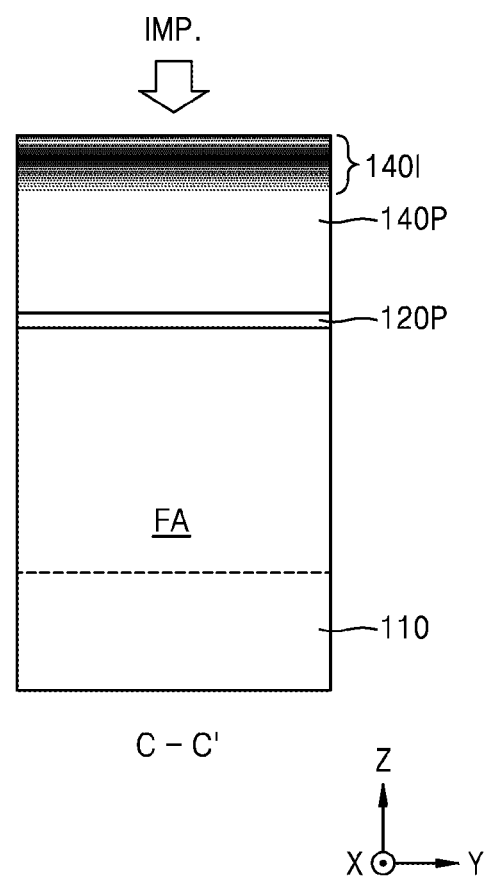

Referring to FIGS. 7A and 7B, ions may be implanted into the pre-dummy gate electrode film 140P by performing ion implantation IMP on the substrate 110 over which the pre-dummy gate electrode film 140P is formed. The ion implantation IMP. may be performed by implanting ions of an element with an atomic weight greater than that of a material of the pre-dummy gate electrode film 140P. For example, when the pre-dummy gate electrode film 140P is formed of polysilicon, that is, silicon atoms, the ion implantation IMP. may be performed by implanting group 3 atoms such as Ga, In, or Ti and/or group 5 atoms such as As, Sb, or Bi having an atomic weight greater than that of silicon atoms into the pre-dummy gate electrode film 140P.

An ion implantation portion 140I may be formed in an upper portion of the pre-dummy gate electrode film 140P due to the ion implantation IMP. The ion implantation portion 140I may be an upper part of the pre-dummy gate electrode film 140P. A portion of the pre-dummy gate electrode film 140P having a highest ion concentration may be closer to the substrate 110 than a top surface of the pre-dummy gate electrode film 140P is.

As described below, the ion implantation portion 1401 into which ions of an element with an atomic weight greater than that of a material of the pre-dummy gate electrode film 140P are implanted may be over-etched than other portions during a process of etching the pre-dummy gate electrode film 140P.

Figure 8A:
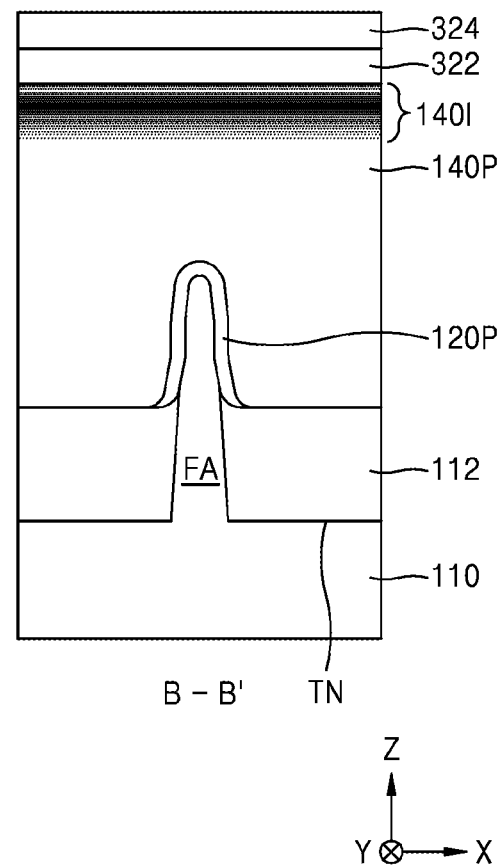
Figure 8B:
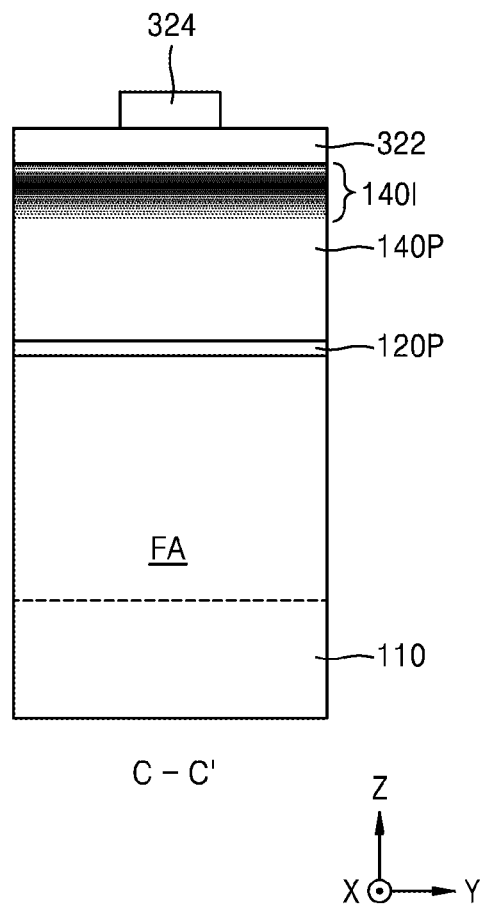

Referring to FIGS. 8A and 8B, a gate mask layer 322 that covers the pre-dummy gate electrode film 140P in which the ion implantation portion 1401 is formed and a second mask pattern 324 that extends in one direction (e.g., the X direction) to cover a part of the gate mask layer 322 are formed. The gate mask layer 322 may include a nitride such as silicon nitride. The second mask pattern 324 may include, for example, but not limited to, a silicon oxynitride film, an SOG film, an SOH film, a photoresist film, or a combination thereof.

Figure 9A:
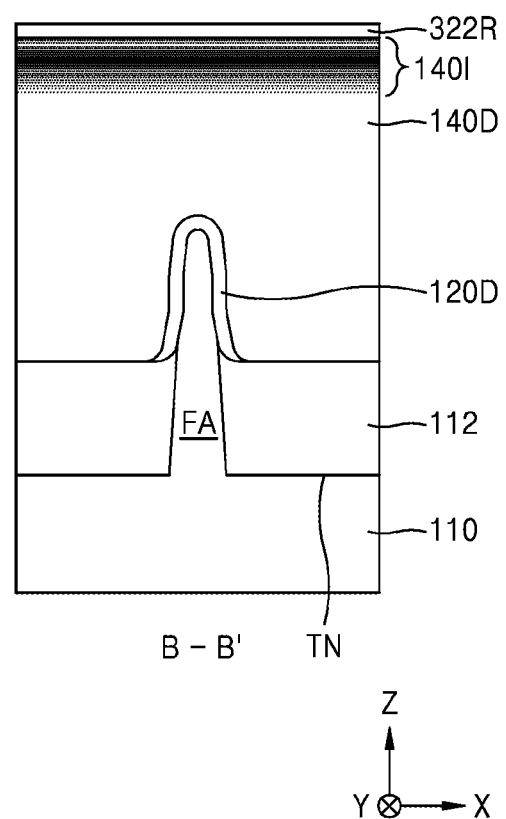
Figure 9B:
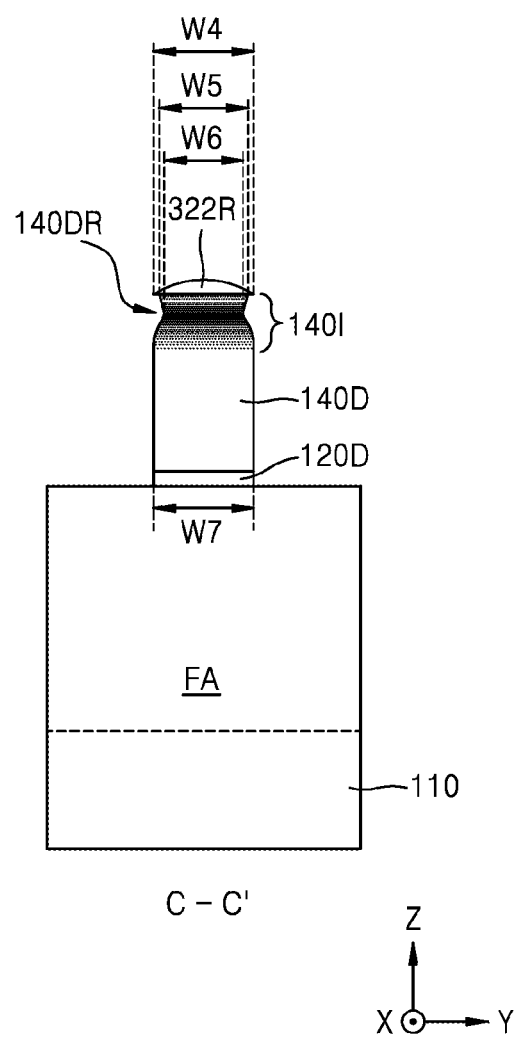

Referring to FIGS. 9A and 9B, the gate mask layer 322 (see FIGS. 8A and 8B) is etched by using the second mask pattern 324 (see FIGS. 8A and 8B) as an etching mask, and then the pre-dummy gate electrode film 140P (see FIGS. 8A and 8B) and the pre-dummy gate insulating film 120P (see FIGS. 8A and 8B) are etched by using the etched gate mask layer 322 as an etching mask, to form a dummy gate electrode 140D and a dummy gate insulating film 120D.

In a process of etching the gate mask layer 322 and/or a process of forming the dummy gate electrode 140D and the dummy gate insulating film 120D, the second mask pattern 324 may be completely removed or may partially remain. Even when a part of the second mask pattern 324 remains, the remaining part of the second mask pattern 324 may be removed by using a subsequent ashing process and/or stripping process.

In the process of forming the dummy gate electrode 140D and the dummy gate insulating film 120D, a part of the gate mask layer 322 may be removed and another part of the gate mask layer 322 may remain as a residual mask layer 322R on the dummy gate electrode 140D.

In a process of etching the pre-dummy gate electrode film 140P in order to form the dummy gate electrode 140D, the ion implantation portion 1401 of the pre-dummy gate electrode film 140P may be over-etched than other portions. In detail, the ion implantation portion 1401 into which atoms with an atomic weight greater than that of a material of the pre-dummy gate electrode film 140P are implanted may be etched in a horizontal direction under the gate mask layer 322 due to the atoms with the great atomic weight.

Accordingly, the ion implantation portion 1401 of the dummy gate electrode 140D may have a dent portion 140DR whose width in one direction (e.g., the Y direction) is less than those of other portions of the dummy gate electrode 140. That is, the ion implantation portion 1401 of the dummy gate electrode 140D may have the dent portion 140DR that is relatively narrow. The dent portion 140DR may be formed in a portion of the ion implantation portion 140 having a highest ion concentration and the dummy gate electrode 140D may have a smallest width at the dent portion 140DR.

Also, since the ion implantation portion 1401 is formed in the upper part of the pre-dummy gate electrode film 140P, in the process of forming the dummy gate electrode 140D, the upper portion of the pre-dummy gate electrode film 140P may be over-etched and a width of a top surface of the dummy-gate electrode 140D may be less than a width of a lower portion of the dummy gate electrode 140D. Accordingly, both ends of the residual mask layer 322R in one direction (e.g., the Y direction) may each have an eaves shape on the dummy gate electrode 140D.

In detail, a fourth width W4 that is a width of a bottom surface of the residual mask layer 322R may be greater than a fifth width W5 that is a width of the top surface of the dummy gate electrode 140D. The fifth width W5 that is a width of the top surface of the dummy gate electrode 140D may be greater than a sixth width W6 that is a width of the dent portion 140DR. The fifth width W5 and the sixth width W6 may be less than a seventh width W7 that is a width of the lower portion of the dummy gate electrode 140D. Although the fourth width W4 that is a width of the bottom surface of the residual mask layer 322R is similar to the seventh width W7 that is a width of the lower portion of the dummy gate electrode 140D, when the dummy gate electrode 140D has a tapered etching profile having an upper portion that is narrower than a lower portion during a process of etching the dummy gate electrode 140D, the seventh width W7 may be greater than the fourth width W4.

Figure 10:
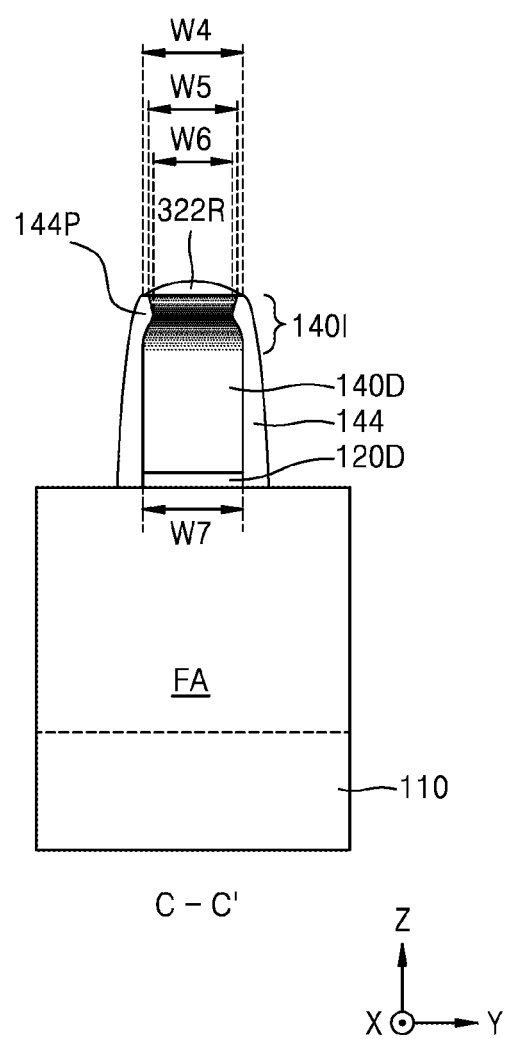

Referring to FIG. 10, the one pair of insulating spacers 144 that cover both side walls of the dummy gate insulating film 120D and the dummy gate electrode 140D are formed. The insulating spacers 144 may include, but not limited to, a silicon nitride film, a silicon oxynitride film, a carbon-containing silicon oxynitride film, or a combination film thereof or may include, but not limited to, an air gap or a low-k dielectric film therein.

The insulating spacers 144 may be formed by forming a pre-spacer layer that conformably covers the substrate 110 over which the dummy gate electrode 140D is formed and performing an etch-back process.

The insulating spacers 144 may include the protrusions 144P that fill a space defined by the dent portion 140DR (see FIG. 9B) of the dummy gate electrode 140D. That is, the insulating spacers 144 may include the protrusions 144P that protrude from portions close to upper ends toward the dummy gate electrode 140D. Accordingly, inner walls of the insulating spacers 144 facing the dummy gate electrode 140D may have curved portions bulging toward the dummy gate electrode 140D at the protrusions 144P.

Since the fourth width W4 that is a width of the bottom surface of the residual mask layer 322R is greater than the fifth width W5 that is a width of the top surface of the dummy gate electrode 140D, a space under the both ends of the residual mask layer 322R each having an eaves shape in one direction (e.g., the Y direction) may be filled with the insulating spacers 144. Accordingly, the top surface and side surfaces of the dummy gate electrode 14D may be covered by the residual mask layer 322R and the insulating spacers 144.

The one pair of insulating spacers 144 formed on both sides of the dummy gate electrode 140D may include the protrusions 144P that face each other. An interval between the one pair of insulating spacers 144 in the one direction (e.g., the Y direction) may decrease at the protrusions 144P due to the protrusions 144P of the one pair of insulating spacers 144. A width of each of the one pair of insulating spacers 144 in the one direction (e.g., the Y direction) may decrease as each insulating spacer 144 extends from the substrate 110 in the direction (e.g., the Z direction) perpendicular to the main surface of the substrate 110, may increase at each of the protrusions 144P, and may decrease again as each insulating spacer 144 extends toward an uppermost end.

In detail, a space between the one pair of insulating spacers 144 may extend to have the seventh width W7, which is constant, in the direction (e.g., the Z direction)

perpendicular to the main surface of the substrate 110 from lower ends of the one pair of insulating spacers 144, may be narrowed to have the sixth width W6, which is less than the seventh width W7, between the protrusions 144P, may be widened again to have the fifth width W5, which is less than the seventh width W7 and greater than the sixth width W6, at the uppermost ends of the one pair of insulating spacers 144. Accordingly, a space between the one pair of insulating spacers 144 may have the sixth width W6, which is a smallest width, at upper portions of the one pair of insulating spacers 144 that are lower than the uppermost ends of the one pair of insulating spacers 144.

Accordingly, the seventh width W7, the sixth width W6, and the fifth width W5 may be respectively substantially the same as the first width W1, the second width W2, and the third width W3 of FIG. 1C.

Figure 11:
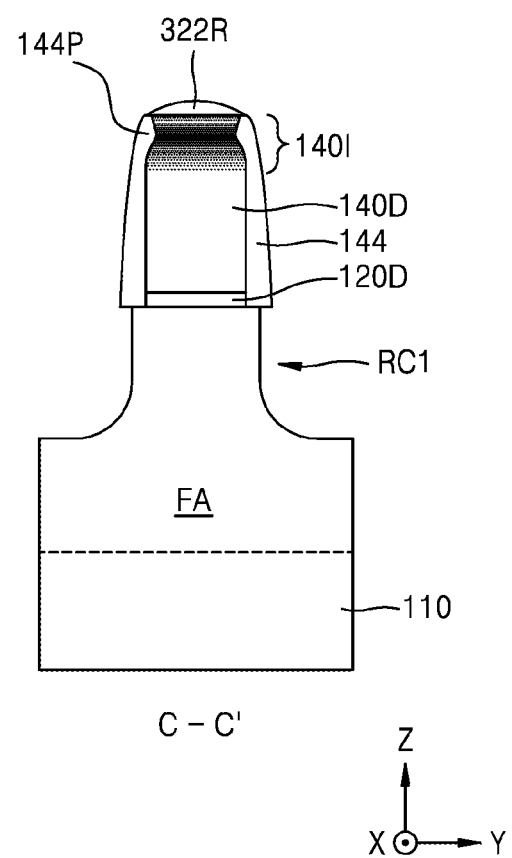

Referring to FIG. 11, a first recess space RC1 is formed by removing an upper part of the fin-shaped active region FA adjacent to the dummy gate electrode 140D on which tine insulating spacers 144 are formed.

In detail, the first recess space RC1 is formed by removing an upper part of the fin-shaped active region FA by using the insulating spacers 144, the dummy gate electrode 140D, and the residual mask layer 322R as etching masks.

In example embodiments, an etching process of forming the first recess space RC1 and an etch-back process of forming the insulating spacers 144 may be performed in situ. A portion of the fin-shaped active region FA under the dummy gate electrode 140D may protrude more than another portion of the fin-shaped active region FA, that is, a portion of the fin-shaped active region FA under the first recess space RC1, due to the first recess space RC1.

Figure 12:
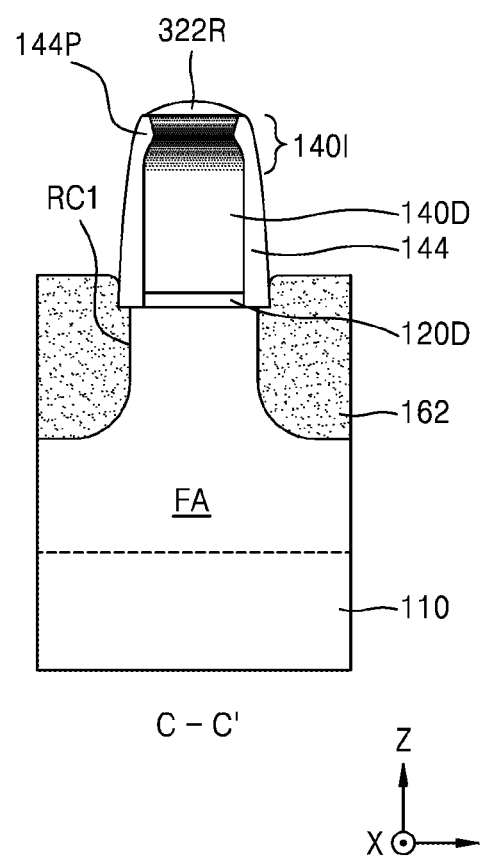

Referring to FIG. 12, the source/drain regions 162 that fill the first recess space RC1 on both sides of the protruding portion of the fin-shaped active region FA are formed. The source/drain regions 162 may be formed by using selective epitaxial growth (SEG) using a surface of the fin-shaped active region FA exposed through the first recess space RC1 as a seed. The source/drain regions 162 may include a semiconductor layer that is epitaxially grown from the fin-shaped active region FA. The source/drain regions 162 may include an embedded SiGe structure including a plurality of SiGe layers that are epitaxially grown, a Si layer that is epitaxially grown, or a SiC layer that is epitaxially grown.

In example embodiments, the source/drain regions 162 may be formed by performing SEG using a silicon source gas such as dichlorosilane ($SiH_2Cl_2$) or a germanium source gas such as germanium tetrahydride ($GeH_4$), to form a single crystalline silicon-germanium (SiGe) layer. In this case, a single crystalline silicon-germanium layer doped with P-type impurities may be formed in at least a part of the source/drain regions 162 by using also a P-type impurity source gas such as diborane ($BeH_6$).

The source/drain regions 162 may be vertically and horizontally grown to fill the first recess space RC1, and top surfaces of the source/drain regions 162 may contact parts of the insulating spacers 144. In this case, the source/drain regions 162 may have pentagonal or hexagonal cross-sectional shapes.

If the insulating spacers 144 do not include the protrusions 144P, an edge portion of an upper end of the dummy gate electrode 140D may be exposed between the insulating spacers 144 and the residual mask layer 322R. That is, in a process of forming the insulating spacers 144 or forming the first recess space RC1, when parts of the insulating spacers 144 and/or a part of the residual mask layer 322R adjacent to the edge portion of the upper end of the dummy gate electrode 140D are removed, the edge portion of the upper end of the dummy gate electrode 140D may be exposed between the insulating spacers 144 and the residual mask layer 322R. In this case, in a process of forming the source/drain regions 162, the exposed edge portion of the upper end of the dummy gate electrode 140D may also function as a seed, and thus an epitaxial layer may be formed from the edge portion of the upper end of the dummy gate electrode 140D.

However, since the insulating spacers 144 of the inventive concept include the protrusions 144P, the dummy gate electrode 140D may not be exposed between the residual mask layer 322R and the insulating spacers 144. In detail, in the process of forming the insulating spacers 144 or forming the first recess space RC1, even when parts of the insulating spacers 144 and/or a part of the residual mask layer 322R adjacent to the edge portion of the upper end of the dummy gate electrode 140D are removed, the dummy gate electrode 140D may not be exposed through the protrusions 144P, and may be covered by the insulating spacers 144 and the residual mask layer 322R. Accordingly, in the process of forming the source/drain regions 162, an epitaxial layer may be limited (and/or prevented) from being formed from the edge portion of the upper end of the dummy gate electrode 140D.

Figure 13A:
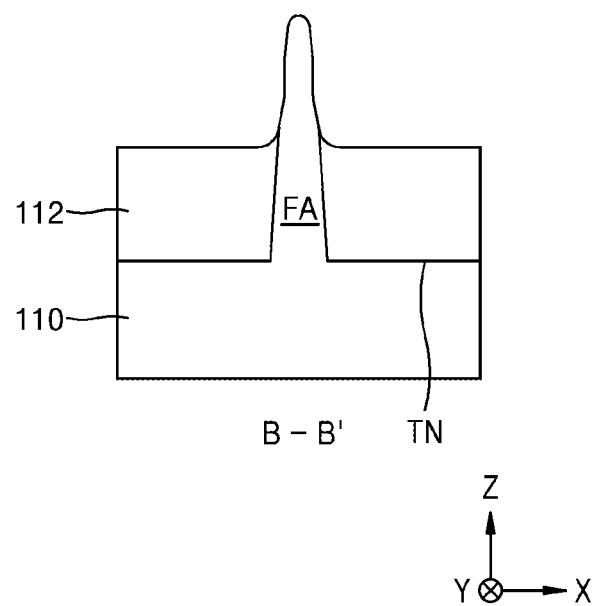
Figure 13B:
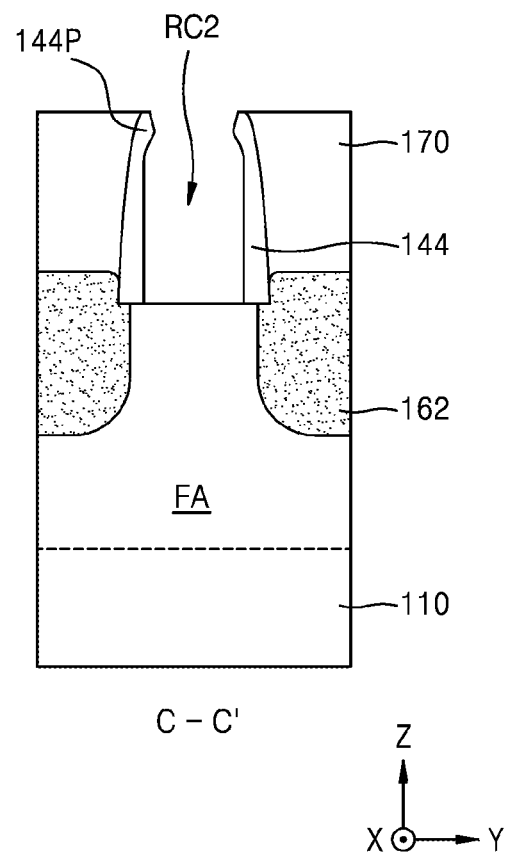

Referring to FIGS. 13A and 13B, the interlayer insulating film 170 that covers the insulating spacers 144 is formed at a side of the insulating spacers 144 opposite to the dummy gate electrode 140D (see FIG. 12). The interlayer insulating film 170 may be formed by forming a pre-interlayer insulating film that covers the source/drain regions 162, the insulating spacers 144, and the residual mask layer 322R (see FIG. 12) and planarizing the pre-interlayer insulating film until the top surface of the dummy gate electrode 140D is exposed. In example embodiments, the pre-interlayer insulating film may be formed to include a silicon oxide such as tonen silazene (TOSZ). The planarization may be performed by using a chemical-mechanical polishing (CMP) process and/or an etch-back process. The residual mask layer 322R may also be removed by using the planarization for forming the interlayer insulating film 170.

In example embodiments, due to the planarization for forming the interlayer insulating film 170, upper parts of the insulating spacers 144 and an upper part of the dummy gate electrode 140D may also be removed.

Next, the exposed dummy gate electrode 140D and the dummy gate insulating film 120D (see FIG. 12) disposed under the exposed dummy gate electrode 140D are removed to expose the inner walls of the insulating spacers 144 and a part of the top surface of the fin-shaped active region FA, and a second recess space RC2 that is defined by the inner walls of the insulating spacers 144 and the exposed top surface of the fin-shaped active region FA is formed.

Figure 14A:
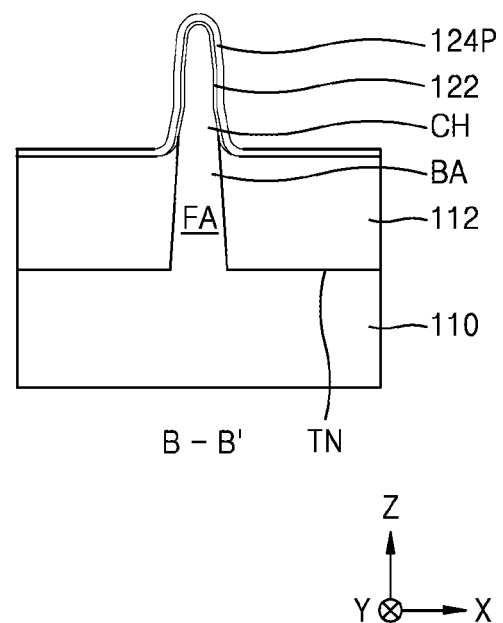
Figure 14B:
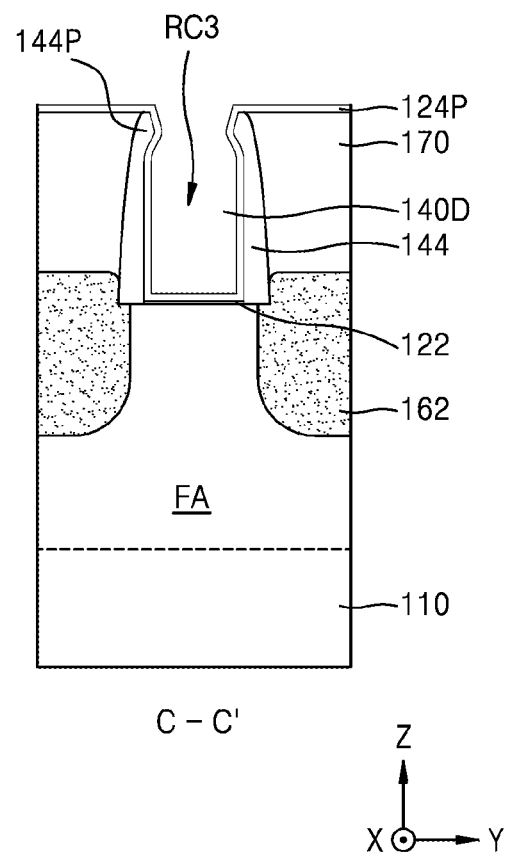

Referring to FIGS. 14A and 14B, the interface film 122 is formed on the exposed top surface of the fin-shaped active region FA. The interface film 122 may be formed of a low-k dielectric material having a relative dielectric constant of about 9 or less, for example, but not limited to, silicon oxide, silicon nitride, silicon oxynitride, gallium oxide, or germanium oxide. The interface film 122 may be an oxide, a nitride, or an oxynitride of a material of the substrate 110. The interface film 122 may have a thickness ranging, for example, but not limited to, from about 5 Å to about 20 Å. The interface film 122 may be formed by using thermal oxidation, ALD, CVD, or PVD.

In example embodiments, the interface film 122 may be formed only on, but not limited to, the top surface of the fin-shaped active region FA that is exposed due to thermal oxidation. For example, when the interface film 122 is formed by using thermal oxidation, ALD, CVD, or PVD, the interface film 122 may be formed on the exposed top surface of the fin-shaped active region FA, the inner walls of the insulating spacers 144, and a top surface of the interlayer insulating film 170.

After the interface film 122 is formed, a high-k dielectric material film 124P that conformably covers a top surface of the interface film 122, the inner walls of the insulating spacers 144, and the top surface of the interlayer insulating film 170 is formed. The high-k dielectric material film 124P may be formed of a high-k dielectric material having a relative dielectric constant ranging from about 10 to about 25 that is higher than that of the interface film 122. The high-k dielectric material film 124P may be formed of a material having a relative dielectric constant that is higher than that of, for example, each of a silicon oxide film and a silicon nitride film. The high-k dielectric material film 124P may be formed of a material selected from among, but not limited to, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof.

The high-k dielectric material film 124P may be formed by using ALD, CVD, or PVD. The high-k dielectric material film 124P may have a thickness ranging, for example, but not limited to, from about 10 Å to about 40 Å.

A third recess space RC3 may be formed between the one pair of insulating spacers 144 due to the interface film 122 and the high-k dielectric material film 124P.

Figure 15A:
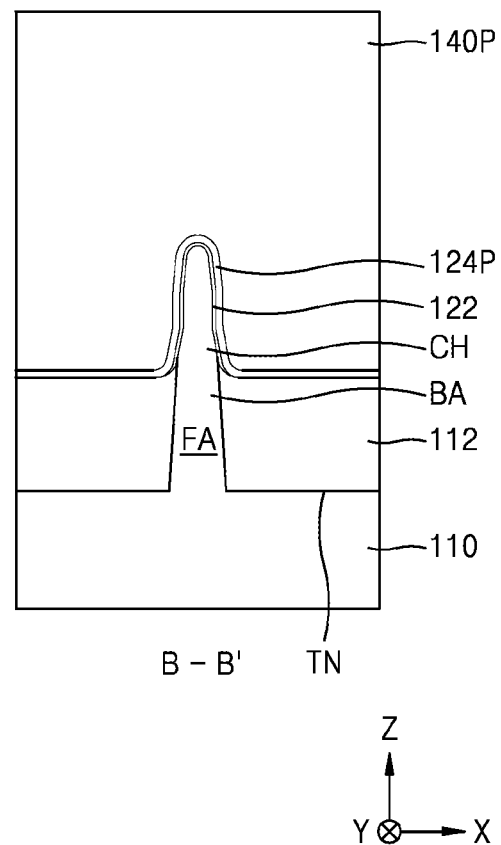
Figure 15B:
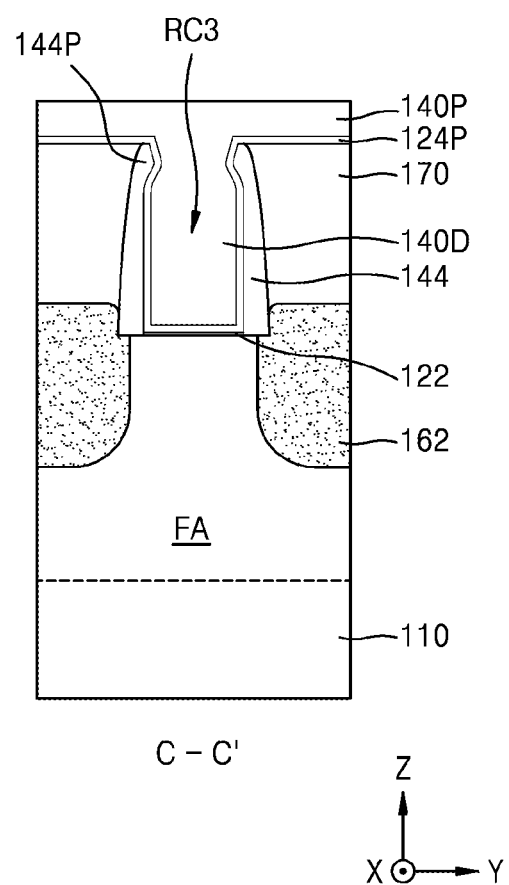

Referring to FIGS. 15A and 15B, a gate electrode material layer 140P that covers the high-k dielectric material film 124P and fills the third recess space RC3 is formed. The gate electrode material layer 140P may be formed of at least one metal selected from among, for example, Ti, Ta, Al, W, Ru, Nb, Mo, Hf, Ni, Co, Pt, Yb, Tb, Dy, Er, and Pd, a metal nitride including at least one metal, or a metal compound such as a carbon-doped metal or a carbon-doped metal nitride.

The gate electrode material layer 140P may include a single film or may have a multi-film structure including a plurality of films. The gate electrode material layer 140P may include, for example, a work function adjusting metal-containing layer and a gap filling metal-containing layer that fills a space formed over the work function adjusting metal-containing layer.

In example embodiments, the gate electrode material layer 140P may have a structure in which a metal nitride layer, a metal layer, a conductive capping layer, and a gap-fill metal film are sequentially stacked. Each of the metal nitride layer and the metal layer may include at least one metal atoms selected from among Ti, W, Ru, Nb, Mo, Hf, Ni, Co, Pt, Yb, Tb, Dy, Er, and Pd. Each of the metal nitride layer and the metal layer may be formed by using ALD, MOALD, or MOCVD. The conductive capping layer may function as a protective film for limiting and/or preventing a surface of the metal layer from being oxidized. Also, the conductive capping layer may function as a wetting layer for easily depositing another conductive layer on the metal layer. The conductive capping layer may be formed of, for example, but not limited to, a metal nitride such as TiN, TaN, or a combination thereof. The gap-fill metal film may extend over the conductive capping layer. The gap-fill metal film may be a W film. The gap-fill metal film may be formed by using ALD, CVD, or PVD. The gap-fill metal film may cover a recess space formed by a stepped portion between regions on a top surface of the conductive capping layer without voids. In example embodiments, the gate electrode material layer 140P may have a TiAlC/TiN/W stacked structure, a TiN/TaN/TiAlC/TiN/W stacked structure, or a TiN/TaN/TiN/TiAlC/TiN/W stacked structure. In the stacked structures, a TiAlC layer or a TiN layer may function as a work function adjusting metal-containing layer.

Next, the gate electrode 140 and the gate insulating film 120 of FIGS. 1A through 1C are formed by performing planarization for removing parts of the gate electrode material layer 140P and the high-k dielectric material film 124P until the interlayer insulating layer 170 is exposed. The gate insulating film 120 may be a portion of the interface film 122 and the high-k dielectric material film 124P in the third recess portion RC3. The gate electrode 140 may be a portion of the gate electrode material layer 140P in the third recess RC3.

In example embodiments, the gate insulating film 120 may be first formed, and then the gate electrode 140 may be formed by forming the gap-fill metal film and/or the conductive capping layer. In this case, the gate insulating film 120 may not be formed on upper portions of the inner walls of the insulating spacers 144. In detail, when parts of the gate electrode material layer 140P and the high-k dielectric material film 124P are removed, remaining parts of the gate electrode material layer 140P and the high-k dielectric material film 124P may fill only a lower part of the third recess RC3 and then the gap-fill metal film and/or the conductive capping layer may fill a remaining space of the third recess RC3, to form the gate electrode 140. In this case, the remaining part of the gate electrode material layer 140P may be the metal nitride layer and the metal layer, or the metal nitride layer, the metal layer, and the conductive capping layer.

Referring to FIGS. 1A through 15B, since the insulating spacers 144 include the protrusions 144P that protrude from upper portions toward the gate electrode 140, an epitaxial layer may be limited (and/or prevented) from being unnecessarily formed from the dummy gate electrode 140D during a process of performing SEG on the source/drain regions 162. Accordingly, electrical failures caused when adjacent gate electrodes 140 are electrically shorted due to the unnecessarily formed epitaxial layer may be limited (and/or prevented), thereby making it possible to form the semiconductor device 200 with improved reliability.

Figure 16A:
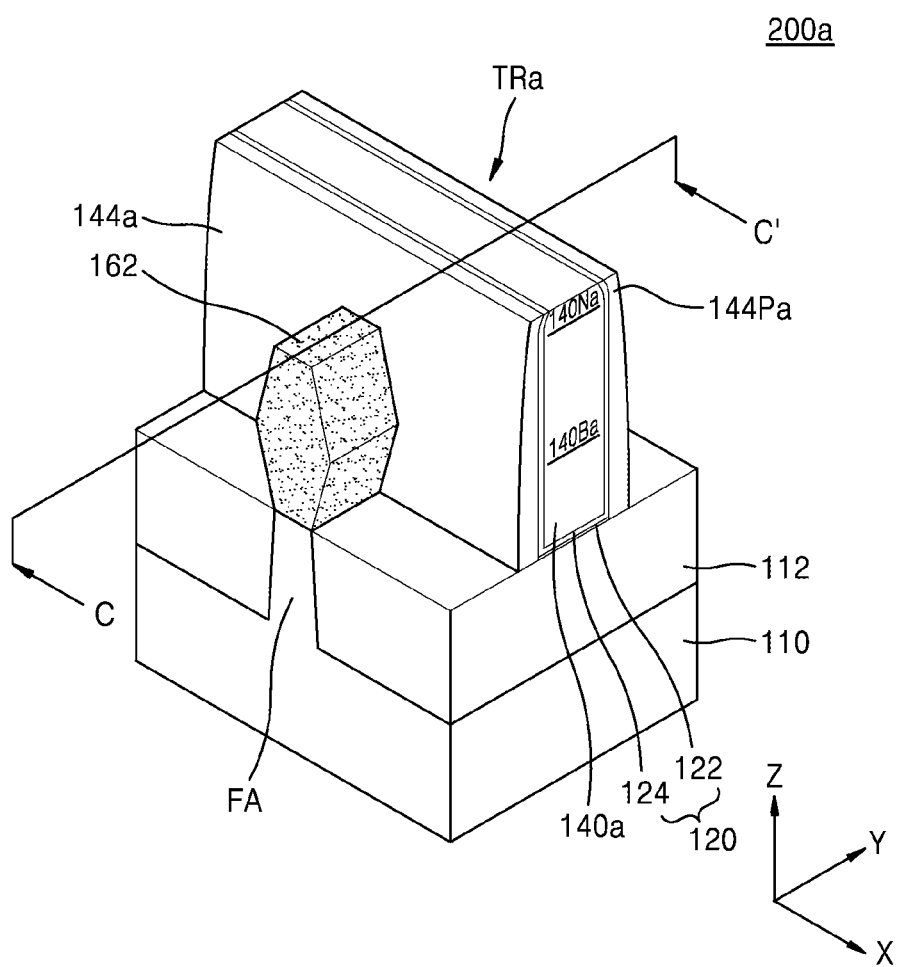
FIGS. 16A and 16B are respectively a perspective view and a cross-sectional view illustrating main elements of a semiconductor device according to example embodiments.
Figure 16B:
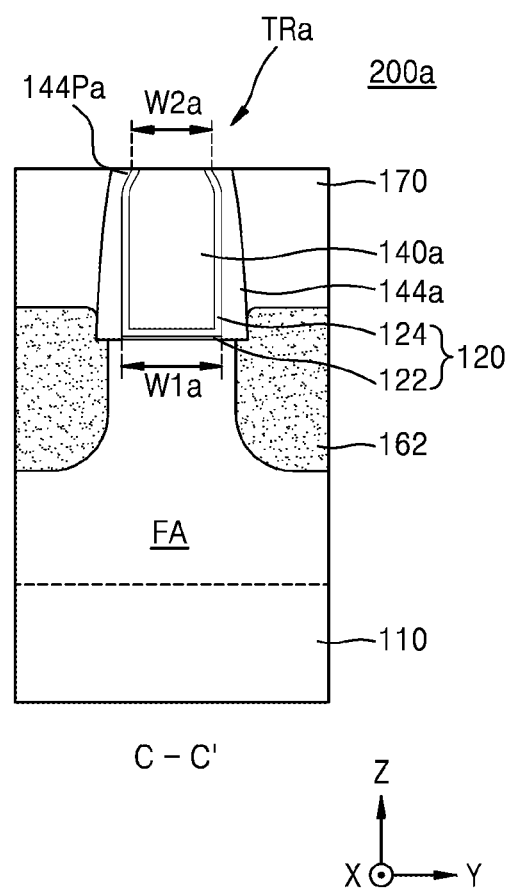

FIGS. 16A and 16B are respectively a perspective view and a cross-sectional view illustrating main elements of a semiconductor device 200a according to example embodiments. FIG. 16A is a perspective view illustrating main elements of the semiconductor device 200a including a transistor having a FinFET structure. FIG. 16B is a cross-sectional view taken along line C-C' of FIG. 16A. In FIGS. 16A and 16B, the same elements as those in FIGS. 1A through 15B are denoted by the same reference numerals, and thus a detailed explanation and a repeated explanation thereof will not be given.

Referring to FIGS. 16A and 16B, the semiconductor device 200a includes the fin-shaped active region FA that protrudes from the substrate 110 in a direction (e.g., the Z direction) perpendicular to the main surface of the substrate 110. The fin-shaped active region FA may extend in one direction (e.g., the Y direction in FIGS. 1A through 1C).

The device isolation film 112 that covers side walls of a lower portion of the fin-shaped active region FA is formed on the substrate 110. The fin-shaped active region FA protrudes upward beyond a top surface of the device isolation film 112 to have a fin shape. The gate insulating film 120 may be formed to cover a top surface and both side walls of the fin-shaped active region FA. A gate electrode 140a may be formed over the top surface and the both side walls of the fin-shaped active region FA to cover the gate insulating film 120.

The gate insulating film 120 may include the interface film 122 having a first relative dielectric constant and the high-k dielectric film 124 formed on the interface film 122 and having a second relative dielectric constant higher than the first relative dielectric constant. The interface film 122 of the semiconductor device 200a may be formed between the top surface and the both side walls of the fin-shaped active region FA and a bottom surface of the gate electrode 140a to face the bottom surface of the gate electrode 140a, and the high-k dielectric film 124 may be formed to face the bottom surface and both side walls of the gate electrode 140a.

The source/drain regions 162 may be formed on portions of the fin-shaped active region FA located on both sides of the gate electrode 140a. The source/drain regions 162 may include a semiconductor layer that is epitaxially grown from the fin-shaped active region FA.

A transistor TRa may be formed at an intersection between the fin-shaped active region FA and the gate electrode 140a. The transistor TRa includes a 3D MOS transistor in which channels are formed on the top surface and the both side walls of the fin-shaped active region FA.

Insulating spacers 144a may be formed on both sides of a gate structure including the gate insulating film 120 and the gate electrode 140a sequentially formed from a surface of the fin-shaped active region FA. As shown in FIG. 16B, the interlayer insulating film 170 that covers the insulating spacers 144a may be formed at a side of the insulating spacers 144a opposite to the gate structure.

The insulating spacers 144a may include protrusions 144Pa that protrude from upper portions, that is, uppermost ends, toward the gate electrode 140a. Accordingly, inner walls of the insulating spacers 144a facing the gate electrode 140a may have curved portions bulging toward the gate electrode 140a at the protrusions 144Pa. The one pair of insulating spacers 144a formed on both sides of the gate electrode 140a may include the protrusions 144Pa that face each other. A width between the one pair of insulating spacers 144a in the one direction (e.g., the Y direction) may decrease at the protrusions 144Pa due to the protrusions 144Pa of the one pair of insulating spacers 144a. A width of each of the one pair of insulating spacers 144a in the one direction (e.g., the Y direction) may decrease as each insulating spacer 144a extends from the substrate 110 in the direction (e.g., the Z direction) perpendicular to the main surface of the substrate 110 and may increase at each of the protrusions 144Pa.

In detail, a space defined between the one pair of insulating spacers 144a may have first and second widths W1a and W2a in the direction (e.g., the Z direction) perpendicular to the main surface of the substrate 110. In detail, a space between lower end portions of the one pair of insulating spacers 144a may have the first width W1a and a space between the protrusions 144Pa of the one pair of insulating spacers 144a may have the second width W2a that is less than the first width W1a.

That is, a space defined between the one pair of insulating spacers 144a may extend to have the first width W1a, which is constant, in the direction (e.g., the Z direction) perpendicular to the main surface of the substrate 110 from the lower ends of the one pair of insulating spacers 144a and may be narrowed to have the second width W2a, which is less than the first width W1a, between the protrusions 144Pa. Accordingly, a space defined between the one pair of insulating spacers 144a may have the second width W2a, which is a smallest width, at upper portions of the one pair of insulating spacers 144a that are lower than the uppermost ends of the one pair of insulating spacers 144a.

The gate insulating film 120 may be formed to cover an inner surface of the space defined between the one pair of insulating spacers 144a. The gate electrode 140a may be formed to cover the gate insulating film 120 and to fill the space defined between the one pair of insulating spacers 144a.

A width of the gate electrode 140a in the one direction (e.g., the Y direction) may change in a similar way to that of a width of the space defined between the one pair of insulating spacers 144a in the direction (e.g., the Z direction) perpendicular to the main surface of the substrate 110.

The gate electrode 140a may include a base portion 140Ba disposed on a portion of the space defined between the one pair of insulating spacers 144a that has the first width W1a and a narrow width portion 140Na disposed on a portion of the space that has the second width W2a. The narrow width portion 140Na of the gate electrode 140a may have a width that is less than that of the base portion 140Ba. Accordingly, the gate electrode 140a may have dents in side walls of a portion corresponding to the protrusions 144Pa of the insulating spacers 144a, that is, in side walls of the narrow width portion 140Na of the gate electrode 140a. That is, dents may be formed in both side walls of an upper portion of the gate electrode 140a facing the one pair of insulating spacers 144a.

The semiconductor device 200a may be formed by using the method of manufacturing the semiconductor device 200 described with reference to FIGS. 2 through 15B. In detail, the semiconductor device 200a may be formed by removing upper parts of the insulating spacers 144 along with parts of the gate electrode material layer 140P (see FIGS. 15A and 15B) and the high-k dielectric material film 124P (see FIGS. 15A and 15B) in a process of performing planarization for removing the parts of the gate electrode material layer 140P and the high-k dielectric material film 124P to form the gate electrode 140a and the gate insulating film 120.

That is, the one pair of insulating spacers 144a of FIGS. 16A and 16B may be formed by removing upper parts of the one pair of insulating spacers 144a corresponding to a portion of the space defined between the one pair of insulating spacers 144 of FIG. 1C that is narrowed to have the second width W2 and then is widened again.

Referring to FIGS. 2 through 16B, since the insulating spacers 144a includes the protrusions 144P that protrude from upper portions toward the gate electrode 140a, an epitaxial layer may be limited (and/or prevented) from being unnecessarily formed from the dummy gate electrode 140D during a process of performing SEG to form the source/drain regions 162. Accordingly, electrical failures caused when adjacent gate electrodes 140a are electrically shorted due to the unnecessarily formed epitaxial layer may be limited (and/or prevented), thereby making it possible to form the semiconductor device 200a with improved reliability.

Figure 17:
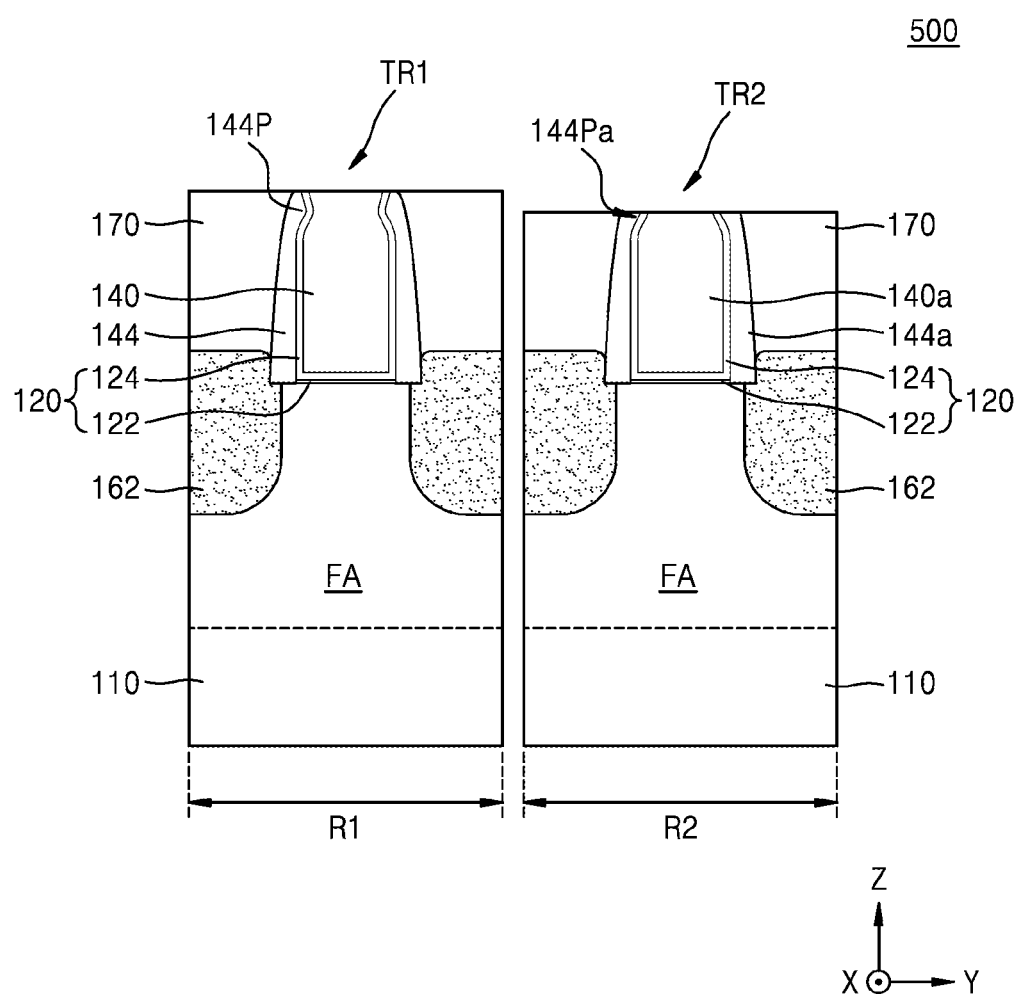
FIG. 17 is a cross-sectional view illustrating main elements of a semiconductor device according to example embodiments.

FIG. 17 is a cross-sectional view illustrating main elements of a semiconductor device 500 according to example embodiments. In FIG. 17, the same elements as those in FIGS. 1A through 16B are denoted by the same reference numerals, and thus a detailed explanation and a repeated explanation thereof will not be given.

Referring to FIG. 17, the semiconductor device 500 includes the substrate 110 including a first region R1 and a second region R2, and a first transistor TR1 and a second transistor TR2 respectively formed in the first region R1 and the second region R2.

The first region R1 and the second region R2 may be different regions on a semiconductor wafer for forming the semiconductor device 500. In example embodiments, the first region R1 and the second region R2 may be spaced apart from each other on the semiconductor wafer for forming the semiconductor device 500. In example embodiments, the first region R1 and the second region R2 may be regions having different pattern densities on the semiconductor wafer for forming the semiconductor device 500. In example embodiments, the gate electrode 140 of the first transistor TR1 formed in the first region R1 and the gate electrode 140a of the second transistor TR2 formed in the second region R2 may have different line widths. In example embodiments, the insulating spacers 144 and 144a and the gate electrodes 140 and 140a may be formed across the first region R1 and the second region R2.

The first transistor TR1 formed in the first region R1 may have the same shape as that of the transistor TR of FIGS. 1A through 1C, and the second transistor TR2 formed in the second region R2 may have the same shape as that of the transistor TRa of FIGS. 16A and 16B.

In detail, the semiconductor device 500 includes, in each of the first region R1 and the second region R2, the fin-shaped active region FA that protrudes from the substrate 110 in the direction (e.g., the Z direction) perpendicular to the main surface of the substrate 110, the device isolation film 112 that covers side walls of a lower portion of the fin-shaped active region FA, the gate insulating film 120 that covers a top surface and both side walls of the fin-shaped active region FA, the gate electrode 140 or 140a that is formed over the top surface and the both side walls of the fin-shaped active regions FA to cover the gate insulating film 120, source/drain regions 162 that are formed on portions of the fin-shaped active region FA located on both sides of the gate electrode 140, the gate insulating film 120 sequentially formed from a surface of the fin-shaped active region FA, and the insulating spacers 144 or 144a that are formed on both sides of the gate electrode 140 or 140a.

The first transistor TR1 and the second transistor TR2 may be formed at intersections between the fin-shaped active region FA and the gate electrodes 140 and 140a in the first region R1 and the second region R2.

The insulating spacers 144 formed in the first region R1 may include the protrusions 144P that protrude from upper portions toward the gate electrode 140. Accordingly, inner walls of the insulating spacers 144 facing the gate electrode 140 may have curved portions bulging toward the gate electrode 140 at the protrusions 144P. The one pair of insulating spacers 144 formed on both sides of the gate electrode 140 may include the protrusions 144P that face each other. A width between the one pair of insulating spacers 144 in one direction (e.g., the Y direction) may decrease at the protrusions 144P due to the protrusions 144P of the one pair of insulating spacers 144. A width of each of the one pair of insulating spacers 144 in the one direction (e.g., the Y direction) may decrease as each insulating spacer 144 extends from the substrate 110 in the direction (e.g., the Z direction) perpendicular to the main surface of the substrate 110, may increase at each of the protrusions 144P, and may decrease again as each insulating spacer 144 extends toward an uppermost end.

A width of the gate electrode 140 formed in the first region R1 in the one direction (e.g., the Y direction) may change in a similar way to that of a width of a space defined between the one pair of insulating spacers 144 in the direction (e.g., the Z direction) perpendicular to the main surface of the substrate 110. That is, dents may be formed in both side walls of an upper portion of the gate electrode 140 facing the one pair of insulating spacers 144.

The insulating spacers 144a formed in the second region R2 may include the protrusions 144Pa that protrude from uppermost ends toward the gate electrode 140a. Accordingly, inner walls of the insulating spacers 144a facing the gate electrode 140a may have curved portions bulging toward the gate electrode 140a at the protrusions 144Pa. The one pair of insulating spacers 144a formed on both sides of the gate electrode 140a may include the protrusions 144Pa that face each other. A width between the one pair of insulating spacers 144a in the one direction (e.g., the Y direction) may decrease at the protrusions 144Pa due to the protrusions 144Pa of the one pair of insulating spacers 144a. A width of each of the one pair of insulating spacers 144a in the one direction (e.g., the Y direction) may decrease as each insulating spacer 144a extends from the substrate 110 in the direction (e.g., the Z direction) perpendicular to the main surface of the substrate 110 and may crease at each of the protrusions 144Pa.

A width of the gate electrode 140a formed in the second region R2 in the one direction (e.g., the Y direction) may change in a similar way to that of a space defined between the one pair of insulating spacers 144a in the direction (e.g., the Z direction) perpendicular to the main surface of the substrate 110. That is, dents may be formed in both side walls of an upper portion of the gate electrode 140a facing the one pair of insulating spacers 144a.

Figure 18:
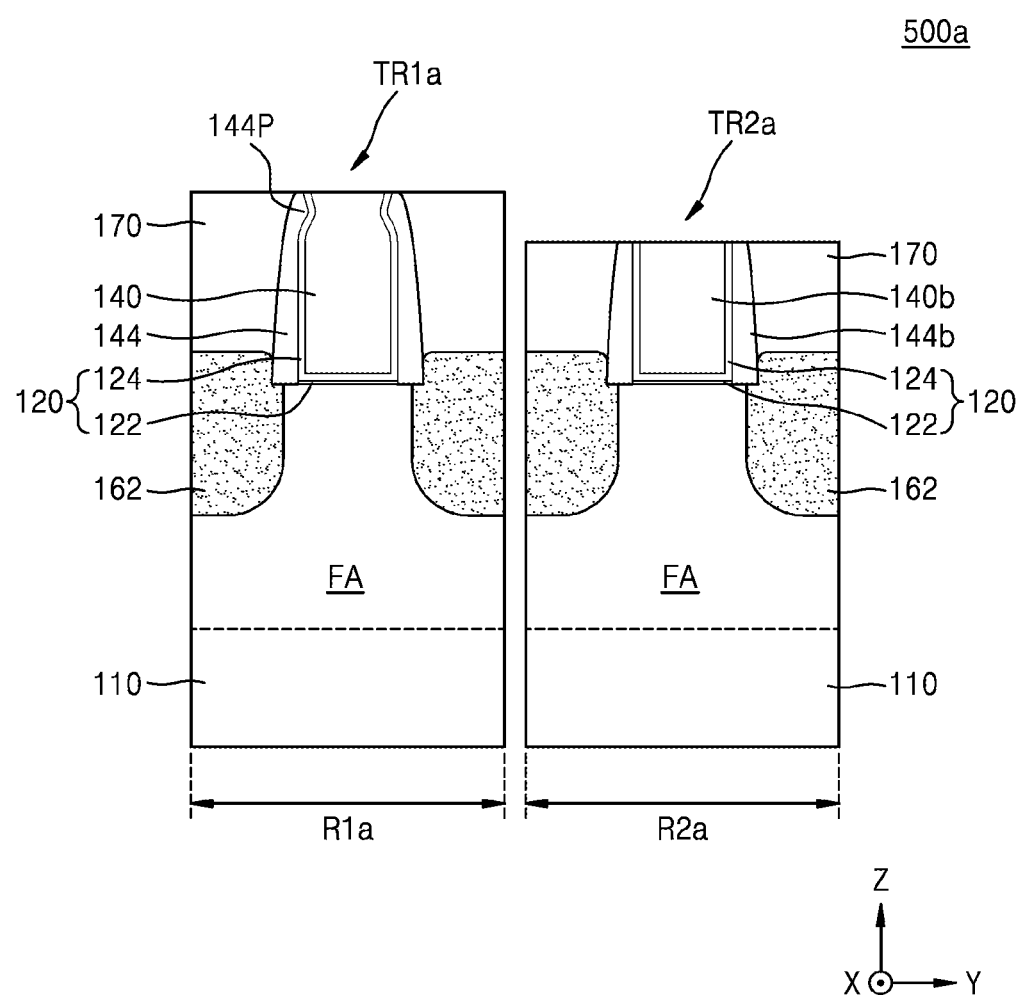
FIG. 18 is a cross-sectional view illustrating main elements of a semiconductor device according to example embodiments.

FIG. 18 is a cross-sectional view illustrating main elements of a semiconductor device 500a according to example embodiments. In FIG. 18, the same elements as those in FIGS. 1A through 17 are denoted by the same reference numerals, and thus a detailed explanation and a repeated explanation thereof will not be given.

Referring to FIG. 18, the semiconductor device 500a includes the substrate 110 including a first region R1a and a second region R2a, and a first transistor TR1a and a second transistor TR2a respectively formed in the first region R1a and the second region R2a.

The first region R1a and the second region R2a may be different regions on a semiconductor wafer for forming the semiconductor device 500a. In example embodiments, the first region R1a and the second region R2a may be spaced apart from each other on the semiconductor wafer for forming the semiconductor device 500a. In example embodiments, the first region R1a and the second region R2a may have different pattern densities on the semiconductor wafer for forming the semiconductor device 500a. In example embodiments, the gate electrode 140 of the first transistor TR1a formed in the first region R1a and a gate electrode 140b of the second transistor TR2a formed in the second region R2a may have different line widths.

The first transistor TR1a formed in the first region R1a may have the same shape as that of the transistor TR of FIGS. 1A through 1C. The second transistor TR2a formed in the second region R2a may have a shape obtained by removing the protrusions 144P, the narrow width portion 140N, and the upper end portion 140T from the transistor TR of FIGS. 1A through 1C or a shape obtained by removing the protrusions 144Pa and the narrow width portion 140Na from the transistor TRa of FIGS. 16A and 16B. In detail, the second transistor TR2a formed in the second region R2a may be formed by removing upper parts of the insulating spacers 144 including the protrusions 144Pa along with parts of the gate electrode material layer 140P (see FIGS. 15A and 15B) and the high-k dielectric material film 124P (see FIGS. 15A and 15B) in a process of performing planarization for removing the parts of the gate electrode material layer 140P and the high-k dielectric material film 124P to form the gate electrode 140b and the gate insulating film 120.

In detail, the semiconductor device 500a includes, in each of the first region R1a and the second region R2a, the fin-shaped active region FA that protrudes from the substrate 110 in the direction (e.g., the Z direction) perpendicular to the main surface of the substrate 110, the device isolation film 112 that covers side walls of a lower portion of the fin-shaped active region FA, the gate insulating film 120 that covers a top surface and both side walls of the fin-shaped active region FA, the gate electrode 140 or 140b that is formed over the top surface and the both side walls of the fin-shaped active region FA to cover the gate insulating film 120, source/drain regions 162 that are formed on portions of the fin-shaped active region FA located on both sides of the gate electrode 140, the gate insulating film 120 that is sequentially formed from a surface of the fin-shaped active region FA, and the insulating spacers 144 or 144b that are formed on both sides of the gate electrode 140 or 140b.

The first transistor TR1a and the second transistor TR2a may be formed at intersections between the fine type active region FA and the gate electrodes 140 and 140b in the first region R1a and the second region R2a.

The insulating spacers 144 formed in the first region R1a may include the protrusions 144P that protrude from upper portions toward the gate electrode 140. Accordingly, inner walls of the insulating spacers 144 facing the gate electrode 140 may have curved portions bulging toward the gate electrode 140 at the protrusions 144P. The one pair of insulating spacers 144 formed on both sides of the gate electrode 140 may include the protrusions 144P that face each other. A width between the one pair of insulating spacers 144 in one direction (e.g., the Y direction) may decrease at the protrusions 144P due to the protrusions 144P of the one pair of insulating spacers 144. A width of each of the one pair of insulating spacers 144 in the one direction (e.g., the Y direction) may decrease as each insulating spacer 144 extends from the substrate 110 in the direction (e.g., the Z direction) perpendicular to the main surface of the substrate 110, may increase at each of the protrusions 144P, and may decrease again as each insulating spacer 144 extends toward an uppermost end.

A width of the gate electrode 140 formed in the first region R1a in the one direction (e.g., the Y direction) may change in a similar way to that of a width of a space defined between the one pair of insulating spacers 144 in the direction (e.g., the Z direction) perpendicular to the main surface of the substrate 110. That is, dents may be formed in both side walls of an upper portion of the gate electrode 140 facing the one pair of insulating spacers 144.

The insulating spacers 144b formed in the second region R2a may not include protrusions that protrude toward the gate electrode 140b. Accordingly, inner walls of the insulating spacers 144b facing the gate electrode 140b may each have substantially a planar shape that extends along a vertical full length of the inner walls of the insulating spacers 144b in the direction (e.g., the Z direction) perpendicular to the main surface of the substrate 110. A width of each of the one pair of insulating spacers 144b in the one direction (e.g., the Y direction) may decrease as each insulating spacer 144b extends from the substrate 110 in the direction (e.g., the Z direction) perpendicular to the main surface of the substrate 110.

A width of the gate electrode 140b formed in the second region R2a in the one direction (e.g., the Y direction) may be constant in the direction (e.g., the Z direction) perpendicular to the main surface of the substrate 110.

Figure 19:
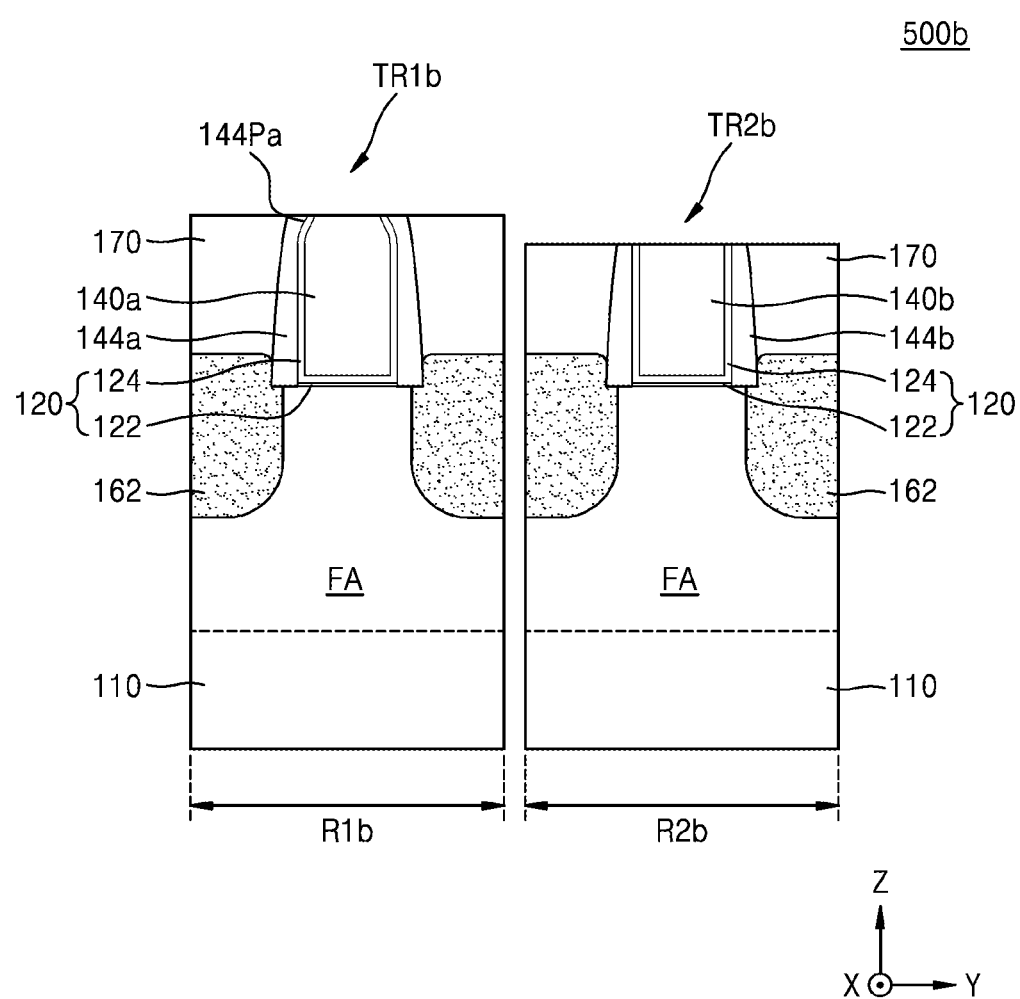
FIG. 19 is a cross-sectional view illustrating main elements of a semiconductor device according to example embodiments.

FIG. 19 is a cross-sectional view illustrating main elements of a semiconductor device 500b according to example embodiments. In FIG. 19, the same elements as those in FIGS. 1A through 18 are denoted by the same reference numerals, and thus a detailed explanation and a repeated explanation thereof will not be given.

Referring to FIG. 19, the semiconductor device 500b includes the substrate 110 including a first region R1b and a second region R2b, and a first transistor TR1b and a second transistor TR2b respectively formed in the first region R1b and the second region R2b.

The first region R1b and the second R2b may be different regions on a semiconductor wafer for forming the semiconductor device 500b. In example embodiments, the first region R1b and the second region R2b may be spaced apart from each other on the semiconductor wafer for forming the semiconductor device 500b. In example embodiments, the first region R1b and the second region R2b may have different pattern densities on the semiconductor wafer for forming the semiconductor device 500b. In example embodiments, the gate electrode 140a of the first transistor TR1b formed in the first region R1b and the gate electrode 140b of the second transistor TR2b formed in the second region R2b may have different line widths.

The first transistor TR1b formed in the first region R1b may have the same shape as that of the transistor TRa of FIGS. 16A and 16B, and the second transistor TR2b formed in the second region R2b may have the same shape as that of the second transistor TR2a of FIG. 18.

In detail, the semiconductor device 500b includes, in each of the first region R1b and the second region R2b, the fin-shaped active region FA that protrudes from the substrate 110 in the direction (e.g., the Z direction) perpendicular to the main surface of the substrate 110, the device isolation film 112 that covers side walls of a lower portion of the fin-shaped active region FA, the gate insulating film 120 that covers a top surface and both side walls of the fin-shaped active region FA, the gate electrode 140a or 140b that is formed over the top surface and the both side walls of the fin-shaped active region FA to cover the gate insulating film 120, source/drain regions 162 that are formed on portions of the fin-shaped active region FA located on both sides of the gate electrode 140, the gate insulating film 120 that is sequentially formed form a surface of the fin-shaped active region FA, and the insulating spacers 144a and 144b that are formed on both sides of the gate electrode 140a or 140b.

The first transistor TR1b and the second transistor TR2b may be formed at intersections between the fin-shaped active region FA and the gate electrodes 140a and 140b in the first region R1b and the second region R2b.

The insulating spacers 144a formed in the first region R1b may include the protrusions 144Pa that protrude from uppermost ends toward the gate electrode 140a. Accordingly, inner walls of the insulating spacers 144a facing the gate electrode 140a may have curved portions at the protrusions 144Pa. The one pair of insulating spacers 144a formed on both sides of the gate electrode 140a may include the protrusions 144Pa that face each other. A width between the one pair of insulating spacers 144a in the one direction (e.g., the Y direction) may decrease at the protrusions 144Pa due to the protrusions 144Pa of the one pair of insulating spacers 144a. A width of each of the one pair of insulating spacers 144a in the one direction (e.g., the Y direction) may decrease as each insulating spacer extends from the substrate 110 in the direction (e.g., the Z direction) perpendicular to the main surface of the substrate 110 and may increase at each of the protrusions 144Pa.

A width of the gate electrode 140a formed in the first region R1b in the one direction (e.g., the Y direction) may change in a similar way to that of a width of a space defined between the one pair of insulating spacers 144a in the direction (e.g., the Z direction) perpendicular to the main surface of the substrate 110. That is, dents may be formed in both side walls of an upper portion of the gate electrode 140a facing the one pair of insulating spacers 144a.

The insulating spacers 144b formed in the second region R2b may not include protrusions that protrude toward the gate electrode 140b. Accordingly, inner walls of the insulating spacers 144b facing the gate electrode 140b may have substantially a planar shape that extends along a vertical full length of the inner walls of the insulating spacers 144b in the direction (e.g., the Z direction) perpendicular to the main surface of the substrate 110. A width of each of the one pair of insulating spacers 144b in the one direction (e.g., the Y direction) may decrease as each insulating spacer 144b extends from the substrate 110 in the direction (e.g., the Z direction) perpendicular to the main surface of the substrate 110.

A width of the gate electrode 140b formed in the second region R2b in the one direction (e.g., the Y direction) may be constant in the direction (e.g., the Z direction) perpendicular to the main surface of the substrate 110.

Figure 20:
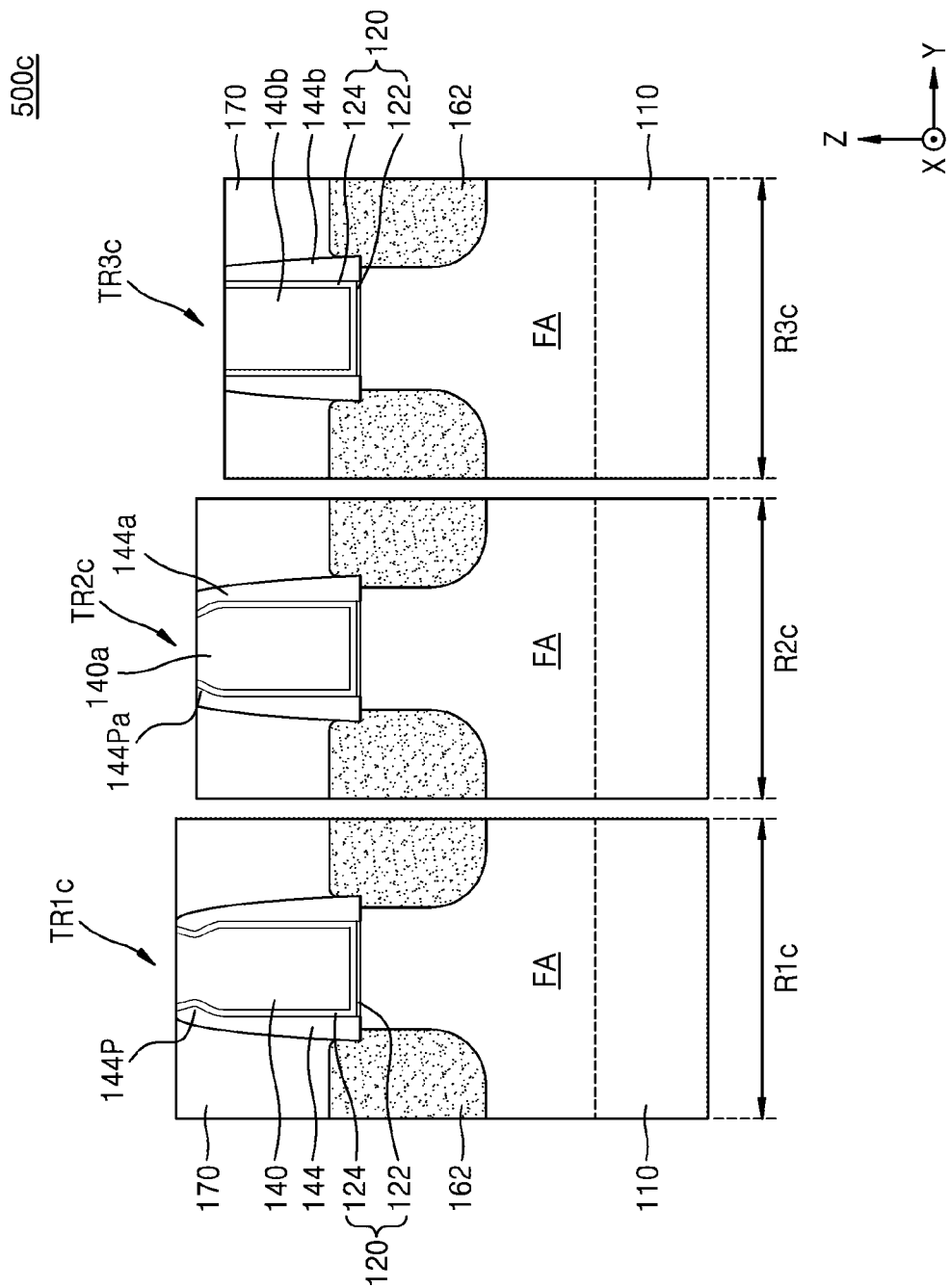
FIG. 20 is a cross-sectional view illustrating main elements of a semiconductor device according to example embodiments.

FIG. 20 is a cross-sectional view illustrating main elements of a semiconductor device 500c according to example embodiments. In FIG. 20, the same elements as those in FIGS. 1A through 19 are denoted by the same reference numerals, and thus a detailed explanation and a repeated explanation thereof will not be given.

Referring to FIG. 20, the semiconductor device 500c includes the substrate 110 including a first region R1c, a second region R2c, and a third region R3c, and a first transistor TR1c, a second transistor TR2c, and a third transistor TR3c respectively formed in the first region R1c, the second region R2c, and the third region R3c.

The first region R1c, the second region R2c, and the third region R3c may be different regions on a semiconductor wafer for forming the semiconductor device 500c. In example embodiments, the first region R1c, the second region R2c, and the third region R3c may be spaced apart from one another on the semiconductor wafer for forming the semiconductor device 500c. In example embodiments, the first region R1c, the second region R2c, and the third region R3c may have different pattern densities on the semiconductor wafer for forming the semiconductor device 500c. In example embodiments, the gate electrode 140 of the first transistor TR1c formed in the first region R1c, the gate electrode 140a of the second transistor TR2c formed in the second region R2c, and the gate electrode 140b of the third transistor TR3c formed in the third region R3c may have different line widths.

The first transistor TR1c formed in the first region R1c may have the same shape as that of the transistor TR of FIGS. 1A through 1C, the second transistor TR2c formed in the second region R2c may have the same shape as that of the transistor TRa of FIGS. 16A and 16B, and the third transistor TR3c formed in the third region R3c may have the same shape as that of the second transistor TR2a of FIG. 18.

In detail, the semiconductor device 500c includes, in each of the first region R1c, the second region R2c, and the third region R3c, the fin-shaped active region FA that protrudes from the substrate 110 in the direction (e.g., the Z direction) perpendicular to the main surface of the substrate 110, the device isolation film 112 that covers side walls of a lower portion of the fin-shaped active region FA, the gate insulating film 120 that covers a top surface and both side walls of the fin-shaped active region FA, the gate electrode 140, 140a, or 140b that is formed over the top surface and the both side walls of the fin-shaped active region FA to cover the gate insulating film 120, source/drain regions 162 that are formed on portions of the fin-shaped active region FA located on both sides of the gate electrode 140, the gate insulating film 120 that is sequentially formed from a surface of the fin-shaped active region FA, and the insulating spacers 144, 144a, or 144b that are formed on both sides of the gate electrode 140, 140a, or 140b.

The first transistor TR1c, the second transistor TR2c, and the third transistor TR3c may be formed at intersections between the fin-shaped active region FA and the gate electrodes 140, 140a, and 140b in the first region R1c, the second region R2c, and the third region R3c.

The insulating spacers 144 formed in the first region R1c may include the protrusions 144P that protrude from upper portions toward the gate electrode 140. Accordingly, inner walls of the insulating spacers 144 facing the gate electrode 140 may have curved portions at the protrusions 144P. The one pair of insulating spacers 144 formed on both sides of the gate electrode 140 may include the protrusions 144P that face each other. A width between the one pair of insulating spacers 144 in the one direction (e.g., the Y direction) may decrease at the protrusions 144P due to the protrusions 144P of the one pair of insulating spacers 144. A width of each of the one pair of insulating spacers 144 in the one direction (e.g., the Y direction) may decrease as each insulating spacer 144 extends from the substrate 110 in the direction (e.g., the Z direction) perpendicular to the main surface of the substrate 110, may increase at each of the protrusions 144P, and may decrease again as each insulating spacer 144 extends toward an uppermost end.

A width of the gate electrode 140 formed in the first region R1c in the one direction (e.g., the Y direction) may change in a similar way to that of a width of a space defined between the one pair of insulating spacers 144 in the direction (e.g., the Z direction) perpendicular to the main surface of the substrate 110. That is, dents may be formed in both side walls of an upper portion of the gate electrode 140 facing the one pair of insulating spacers 144.

The insulating spacers 144a formed in the second region R2c may include the protrusions 144Pa that protrude from uppermost ends toward the gate electrode 140a. Accordingly, inner walls of the insulating spacers 144a facing the gate electrode 140a may have curved portions at the protrusions 144Pa. The one pair of insulating spacers 144a formed on both sides of the gate electrode 140a may include the protrusions 144Pa that face each other. A width between the one pair of insulating spacers 144a in the one direction (e.g., the Y direction) may decrease at the protrusions 144Pa due to the protrusions 144Pa of the one pair of insulating spacers 144a. A width of each of the one pair of insulating spacers 144a in the one direction (e.g., the Y direction) may decrease as each insulating spacer 144a extends from the substrate 110 in the direction (e.g., the Z direction) perpendicular to the main surface of the substrate 110 and may increase at each of the protrusions 144Pa.

A width of the gate electrode 140a formed in the second region R2c in the one direction (e.g., the Y direction) may change in a similar way to that of a width of a space defined between the one pair of insulating spacers 144a in the direction (e.g., the Z direction) perpendicular to the main surface of the substrate 110. That is, dents may be formed in both side walls of an upper portion of the gate electrode 140a facing the one pair of insulating spacers 144a.

The insulating spacers 144b formed in the third region R3c may not include protrusions that protrude toward the gate electrode 140b. Accordingly, inner walls of the insulating spacers 144b facing the gate electrode 140b may have substantially a planar shape that extends along a vertical full length of the inner walls of the insulating spacers 144b in the direction (e.g., the Z direction) perpendicular to the main surface of the substrate 110. A width of each of the one pair of insulating spacers 144b in the one direction (e.g., the Y direction) may decrease as each insulating spacer 144b extends from the substrate 110 in the direction (e.g., the Z direction) perpendicular to the main surface of the substrate 110.

A width of the gate electrode 140b formed in the third region R3c in the one direction (e.g., the Y direction) may be constant in the direction (e.g., the Z direction) perpendicular to the main surface of the substrate 110.

Figure 21:
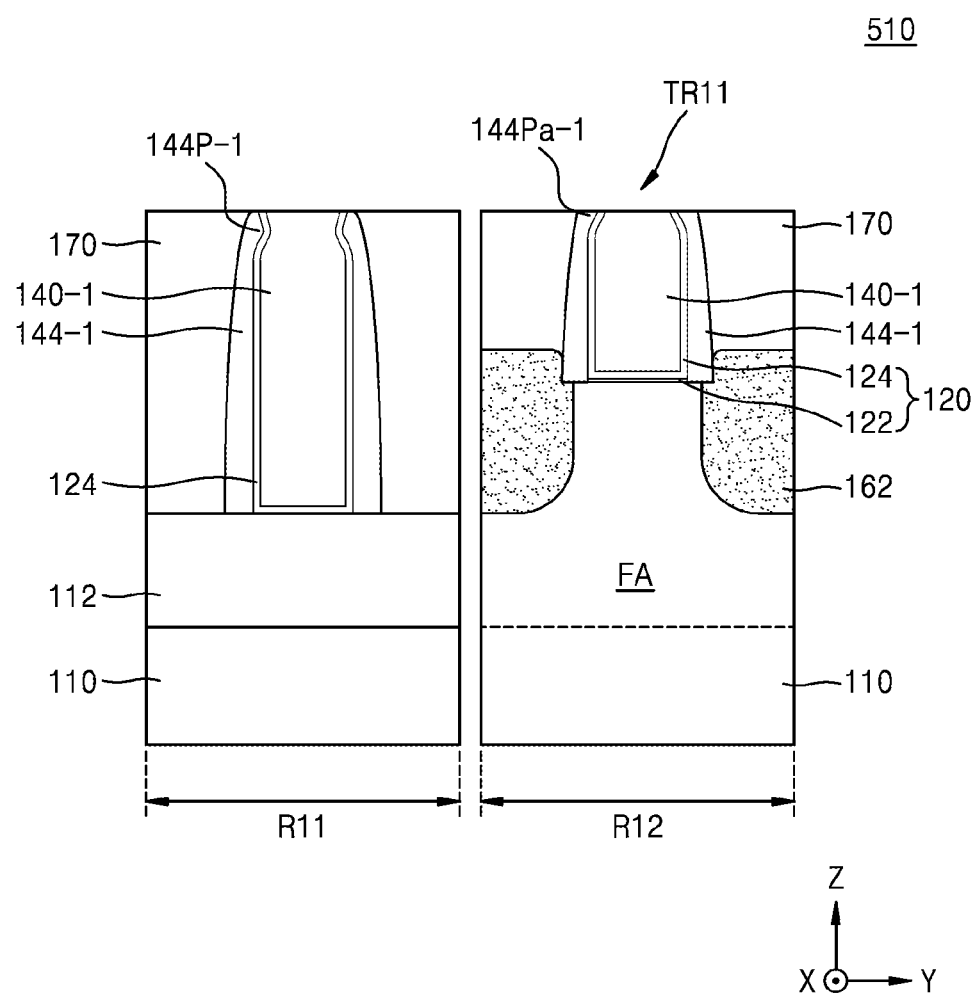
FIG. 21 is a cross-sectional view illustrating main elements of a semiconductor device according to example embodiments.

FIG. 21 is a cross-sectional view illustrating main elements of a semiconductor device 510 according to example embodiments. In FIG. 21, the same elements as those in FIGS. 1A through 20 are denoted by the same reference numerals, and thus a detailed explanation and a repeated explanation thereof will not be given.

Referring to FIG. 21, the semiconductor device 510 includes the substrate 110 including a first region R11 and a second region R12. A transistor TR11 may be formed in the second region R12.

Gate electrodes formed in the first region R11 and the second region R12 may be different portions of at least one gate electrode 140-1 that are connected to each other and extend in a linear shape. That is, the first region R11 and R12 may be regions in which different portions of at least one gate electrode 140-1 that are connected to each other in the semiconductor device 510 and extend in a linear shape are located. The first region R11 may be a region in which a part of the gate electrode 140-1 is disposed on the device isolation film 112 and the second region R12 may be a region in which a part of the gate electrode 140-1 is disposed on the fin-shaped active region FA to form the transistor TR11.

Although top surfaces of portions of the pre-dummy gate electrode film 140P disposed on the device isolation film 112 and the fin-shaped active region FA are at the same level from the main surface of the substrate 110 in FIGS. 6A and 6B, a top surface of a portion of the pre-dummy gate electrode film 140P disposed on at least a part of the device isolation film 112 may be lower than a top surface of a portion of the pre-dummy gate electrode film 140P disposed on the fin-shaped active region FA with respect to the main surface of the substrate 110, due to distances from the fin-shaped active region FA and when a plurality of the fin-shaped active regions FA are formed, a density of the fin-shaped active regions FA.

As such, when top surfaces of portions of the pre-dummy gate electrode film 140P are at different levels according to regions, top surfaces of portions of the pre-dummy gate electrode film 140P having a highest ion concentration may be at different levels, in a process of forming the ion implantation portion 1401 as shown in FIGS. 7A and 7B.

In detail, when a top surface of a portion of the pre-dummy gate electrode film 140P disposed on at least a part of the device isolation film 112 is lower than a top surface of a portion of the pre-dummy gate electrode film 140P disposed on the fin-shaped active region FA with respect to the main surface of the substrate 110, a top surface of a portion of the pre-dummy gate electrode film 140P having a highest ion concentration disposed on at least a part of the device isolation film 112 may be lower than a top surface of a portion of the pre-dummy gate electrode film 140P having a highest ion concentration portion disposed on the fin-shaped active region FA, in a process of forming the ion implantation portion 1401.

Since first and second protrusions 144P-1 and 144Pa-1 of insulating spacers 144-1 are formed along a portion of the pre-dummy gate electrode film 140P having a highest ion concentration, the first protrusions 144P-1 of portions of the insulating spacers 144-1 formed in the first region R11 and the second protrusions 144Pa-1 of portions of the insulating spacers 144-1 formed in the second regions R12 may be at different levels. That is, the second protrusions 144Pa-1 may be higher than the first protrusions 144P-1 with respect to the main surface of the substrate 110.

Portions of the insulating spacers 144-1 and a portion of the gate electrode 140-1 disposed in the first region R11, that is, on at least a part of the device isolation film 112, may have similar shapes to those of the insulating spacers 144 and the gate electrode 140 of FIGS. 1A through 1C, and portions of the insulating spacers 144-1 and a portion of the gate electrode 140-1 disposed in the second region R12, that is, on the fine type active region FA, may have similar shapes to those of the insulating spacers 144a and the gate electrode 140a of FIGS. 16A and 16B, and thus a detailed explanation thereof will not be given.

Figure 22:
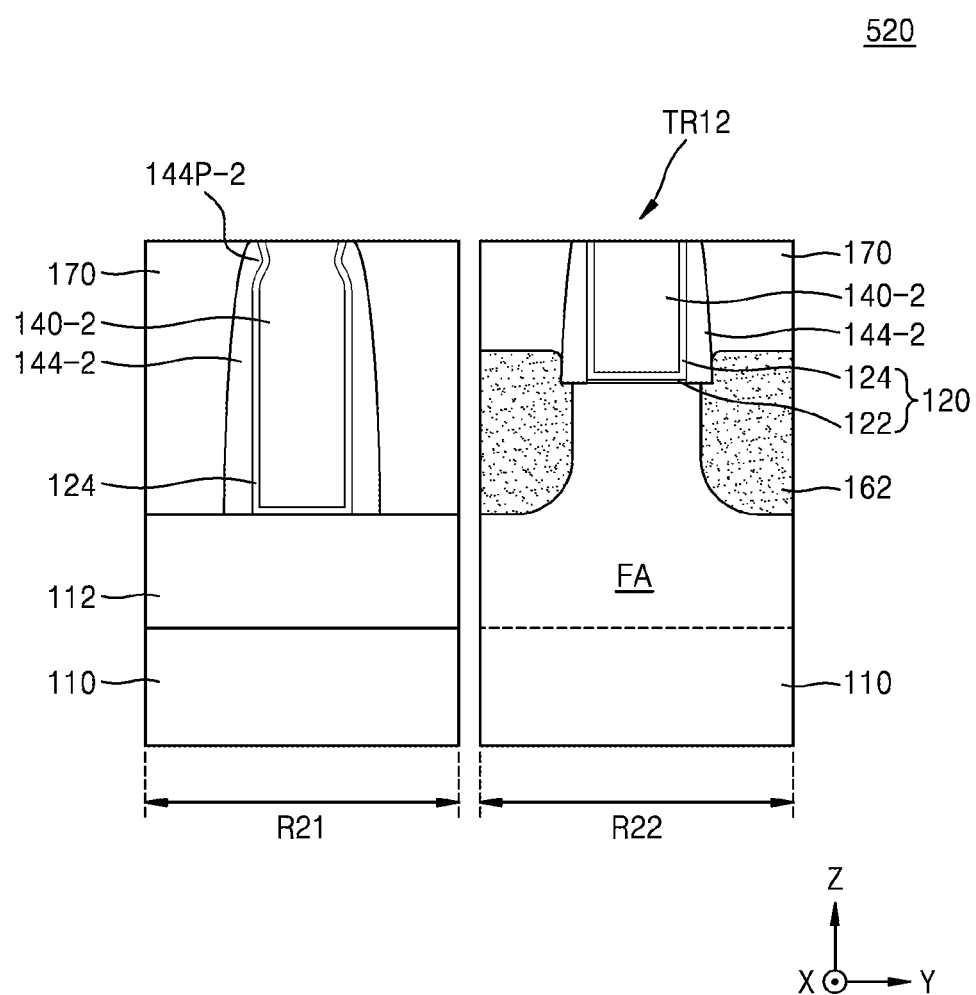
FIG. 22 is a cross-sectional view illustrating main elements of a semiconductor device according to example embodiments.

FIG. 22 is a cross-sectional view illustrating main elements of a semiconductor device 520 according to example embodiments. In FIG. 22, the same elements as those in FIGS. 1A through 21 are denoted by the same reference numerals, and thus a detailed explanation and a repeated explanation thereof will not be given.

Referring to FIG. 22, the semiconductor device 520 includes the substrate 110 including a first region R21 and a second region R22. A transistor TR12 may be formed in the second region R22.

Gate electrodes formed in the first region R21 and the second region R22 may be different portions of at least one gate electrode 140-2 that are connected to each other and extend in a linear shape. That is, the first region R21 and the second region R22 may be regions in which different portions of at least one gate electrode 140-2 that are connected to each other in the semiconductor device 520 and extend in a linear shape are located. The first region R21 may be a region in which a part of the gate electrode 140-2 is disposed on the device isolation film 112 and the second region R22 may be a region in which a part of the gate electrode 140-2 is disposed on the fin-shaped active region FA to form the transistor TR12.

Protrusions 144P-2 of insulating spacers 144-2 may be formed in the first region R21 and may not be formed in the second region R22. Portions of the insulating spacers 144-2 and a portion of the gate electrode 140-2 disposed in the first region R21, that is, on at least a part of the device isolation film 112, may have similar shapes to those of the insulating spacers 144 and the gate electrode 140 of FIGS. 1A through 1C, and portions of the insulating spacers 144-2 and a portion of the gate electrode 140-2 disposed in the second region R22, that is, on the fine type active region FA, may have similar shapes to those of the insulating spacers 144b and the gate electrode 140b of FIG. 18, and thus a detailed explanation thereof will not be given.

Also, although not shown in FIG. 22, portions of the insulating spacers 144-2 and a portion of the gate electrode 140-2 disposed in the first region R21, that is, on at least a part of the device isolation film 112, may have similar shapes to those of the insulating spacers 144a and the gate electrode 140a of FIGS. 16A and 16B, and portions of the insulating spacers 144-2 and a portion of the gate electrode 140-2 disposed in the second region R22, that is, on the fin-shaped active region FA, may have similar shapes to those of the insulating spacers 144b and the gate electrode 140b of FIG. 18, and thus a detailed explanation thereof will not be given.

Figure 23:
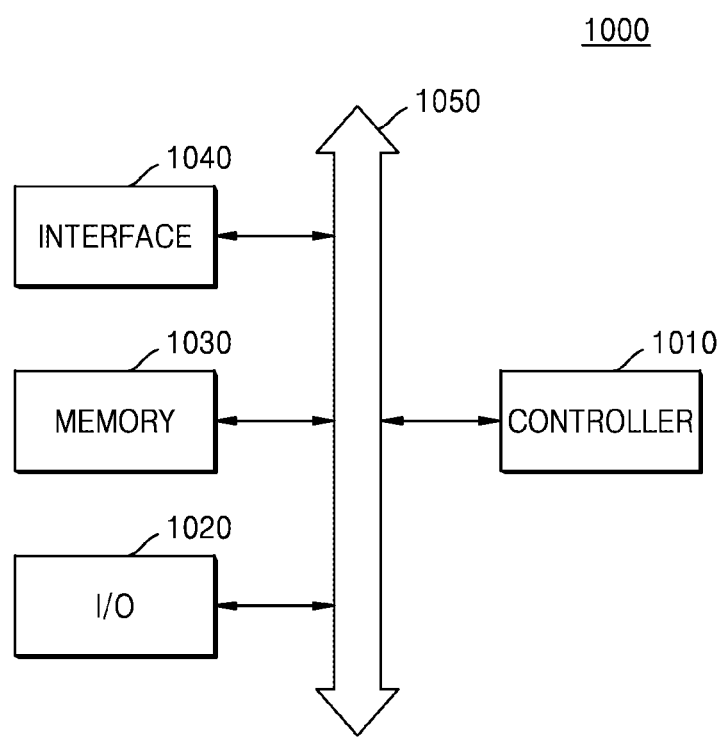
FIG. 23 is a block diagram of an electronic system according to example embodiments.

FIG. 23 is a block diagram of an electronic system 1000 according to example embodiments.

Referring to FIG. 23, the electronic system 1000 includes a controller 1010, an input/output (I/O) device 1020, a memory 1030, and an interface 1040, which are connected to one another via a bus 1050.

The controller 1010 may include at least one of a microprocessor, a digital signal processor, and a similar processor. The I/O device 1020 may include at least one of a keypad, a keyboard, and a display. The memory 1030 may be used to store a command that is executed by the controller 1010. For example, the memory 1030 may be used to store user data.

The electronic system 1000 may constitute a wireless communication apparatus or an apparatus for wirelessly transmitting and and/or receiving information. In order for the electronic system 1000 to transmit/receive data through a wireless communication network, the interface 1040 may be a wireless interface. The interface 1040 may include an antenna and/or a wireless transceiver. In example embodiments, the electronic system 1000 may be used in a communication interface protocol of a third generation communication system such as code division multiple access (CDMA), global system for mobile communications (GSM), north American digital cellular (NADC), extended-time division multiple access (E-TDMA), and/or wide band code division multiple access (WCDMA). The electronic system 1000 includes at least one of the semiconductor devices of FIGS. 1A through 22 and semiconductor devices manufactured by using the methods of manufacturing the semiconductor devices and various modifications of the methods within the scope of the inventive concept.

According to a semiconductor device and the method of manufacturing the same of the one or more embodiments, since insulating spacers formed on both side walls of a dummy gate electrode include protrusions, the dummy gate electrode may not be exposed through a residual mask layer that covers a top surface of the dummy gate electrode and the insulating spacers that cover the side walls of the dummy gate electrode. Accordingly, an epitaxial layer may be limited (and/or prevented) from being formed from the dummy gate electrode during a process of forming source/drain regions by performing SEG. Accordingly, the method of manufacturing the semiconductor device may limit and/or prevent electrical failures caused when the epitaxial layer is unnecessarily formed and thus adjacent gate electrodes are electrically shorted, and the semiconductor device manufactured by using the method may have improved reliability.

While example embodiments of inventive concepts have been particularly shown and described, it will be understood that various changes in form and details may be made therein without departing from the spirit and scope of the following claims.

What is claimed is:

1. A semiconductor device comprising:
 a substrate including a fin-shaped active region that protrudes from the substrate, the fin-shaped active region including a first side wall opposite a second side wall;
 a gate insulating film covering a top surface, the first side wall, and the second side wall of the fin-shaped active region;
 a gate electrode on the top surface, the first side wall, and the second side wall of the fin-shaped active region, the gate electrode covering the gate insulating film, the gate electrode including a first sidewall opposite a second sidewall;
 one pair of insulating spacers on the first sidewall and the second sidewall of the gate electrode, upper portions of the one pair of insulating spacers including protrusions that protrude from the upper portions of the one pair of insulating spacers toward the gate electrode; and
 a source region and a drain region on the substrate and respectively located adjacent to the first sidewall and the second sidewall of the gate electrode such that the gate electrode extends between the source region and the drain region, the source region and the drain region forming a source/drain pair, wherein
 the upper portions of the one pair of insulating spacers are defined from regions that extend from uppermost surfaces to heights greater than middle heights, respectively, for the one pair of insulating spacers.

2. The semiconductor device of claim 1, wherein the protrusions of the one pair of insulating spacers face each other.

3. The semiconductor device of claim 1, wherein the protrusions are lower than uppermost ends of the one pair of insulating spacers.

4. The semiconductor device of claim 3, wherein
 the one pair of insulating spacers are spaced apart from each other by a first width between lower ends of the one pair of insulating spacers, by a second width between the protrusions of the one pair of insulating spacers, and by a third width between the uppermost ends of the one pair of insulating spacers,
 the second width is less than the first width, and
 the third width is less than the first width and greater than the second width.

5. The semiconductor device of claim 1, wherein the protrusions are on uppermost ends of the one pair of insulating spacers.

6. The semiconductor device of claim 5, wherein
 the one pair of insulating spacers are spaced apart from each other by a first width between lower ends of the one pair of insulating spacers and by a second width between the uppermost ends of the one pair of insulating spacers, and
 the second width is less than the first width.

7. The semiconductor device of claim 1, wherein a width of each of the one pair of insulating spacers at each of the protrusions is greater than a width of the each of the one pair of insulating spacers at a portion lower than the protrusions.

8. The semiconductor device of claim 7, wherein a width of each of the one pair of insulating spacers at a portion higher than each of the protrusions is less than a width of each of the one pair of insulating spacers at the protrusions.

9. The semiconductor device of claim 1, wherein
the gate electrode includes dents corresponding to the protrusions of the one pair of insulating spacers, and
the dents are located in the first sidewall and the second sidewall of the gate electrode.

10. The semiconductor device of claim 1, wherein a minimum width of the gate electrode and the protrusions are at a same height in the semiconductor device.

11. A semiconductor device comprising:
a substrate including a trench that defines a fin-shaped active, region extending in a first direction, the fm-shaped active region including a first side wall opposite a second side wall;
a source region and a drain region spaced apart from each other on the fm-shaped active region; and
a gate structure on a portion of the fin-shaped active region between the source region and the drain region,
the gate structure extending in a second direction that crosses the first direction,
the gate structure including a gate electrode on a gate insulating film,
the gate electrode including a first sidewall opposite a second sidewall,
an upper region of the gate electrode including dents formed in the first sidewall and the second sidewall of the gate electrode, respectively,
the gate insulating film covering a top surface, the first side wall, and the second side wall of the fin-shaped active region,
the gate insulating film including a curved part that curves into the dents of the gate electrode, wherein
the upper region of the gate electrode is defined from a portion of the gate electrode that extends from an uppermost surface of the gate electrode to a height greater than a middle height of the gate electrode.

12. The semiconductor device of claim 11, further comprising:
a pair of insulating spacers on the portion of the fin-shaped active region between the source region and the drain region, wherein
the portion of the fm-shaped active region extends between the source region and the drain region,
the pair of insulating spacers covering the first sidewall and the second sidewall of the gate electrode, and
the pair of insulating spacers include protrusions that protrude from upper portions of the pair of insulating spacers towards the dents in the gate electrode.

13. The semiconductor device of claim 12, wherein
the dents are below a top surface of the gate electrode,
the pair of insulating spacers are spaced apart from each other by a first width between lower ends of the pair of insulating spacers, by a second width between the protrusions of the pair of insulating spacers, and by a third width between the uppermost ends of the pair of insulating spacers,
the second width is less than the first width, and
the third width is less than the first width and greater than the second width.

14. The semiconductor device of claim 12, wherein a width of each of the pair of insulating spacers at the protrusions is greater than a width of the each of the pair of insulating spacers at a portion lower than the protrusions.

15. The semiconductor device of claim 11, wherein the gate structure includes an interface film and a high-k dielectric film.

16. The semiconductor device of claim 11, wherein a width of the gate electrode at the dents is less than an average width of the gate electrode in a lower region of the gate electrode.

* * * * *